(12) United States Patent
Wachi et al.

(10) Patent No.: US 8,664,518 B2
(45) Date of Patent: Mar. 4, 2014

(54) ORGANIC PHOTOELECTRIC CONVERSION ELEMENT AND PRODUCING METHOD OF THE SAME

(75) Inventors: Ayako Wachi, Hino (JP); Takahiko Nojima, Tokyo (JP); Yasushi Okubo, Hino (JP); Hiroaki Itoh, Hachioji (JP)

(73) Assignee: Konica Minolta Holdngs, Inc. (JP)

( * ) Notice: Subject to any disclaimer, the term of this patent is extended or adjusted under 35 U.S.C. 154(b) by 688 days.

(21) Appl. No.: 12/962,027

(22) Filed: Dec. 7, 2010

(65) Prior Publication Data

US 2011/0139253 A1    Jun. 16, 2011

(30) Foreign Application Priority Data

Dec. 11, 2009 (JP) ................. 2009-281515

(51) Int. Cl.
*H01L 31/0224* (2006.01)

(52) U.S. Cl.
USPC ............. 136/256; 136/252; 438/57; 438/98

(58) Field of Classification Search
USPC ............... 136/254–265; 438/57, 98
See application file for complete search history.

(56) References Cited

U.S. PATENT DOCUMENTS

| 5,331,183 A | 7/1994 | Sariciftci et al. |
| 2007/0074316 A1 | 3/2007 | Alden et al. |

FOREIGN PATENT DOCUMENTS

| JP | 2006-519712 A | 8/2006 |
| WO | 2004/069736 A2 | 8/2004 |

*Primary Examiner* — Jayne Mershon
(74) *Attorney, Agent, or Firm* — Cantor Colburn LLP

(57) ABSTRACT

Provided is an organic photoelectric conversion element containing: a first electrode; a second electrode; and an organic photoelectric conversion layer sandwiched between the first electrode and the second electrode, wherein the first electrode comprises: a conductive fiber layer; and a transparent conductive layer containing a conductive polymer comprising a π conjugated conductive polymer and a polyanion, and an aqueous binder, and at least a part of the transparent conductive layer containing the conductive polymer and the aqueous binder is cross-linked therein.

6 Claims, 2 Drawing Sheets

US 8,664,518 B2

ORGANIC PHOTOELECTRIC CONVERSION ELEMENT AND PRODUCING METHOD OF THE SAME

CROSS-REFERENCE TO RELATED APPLICATION

This application is based on Japanese Patent Application No. 2009-281515 filed on Dec. 11, 2009 with Japan Patent Office, the entire content of which is hereby incorporated by reference.

TECHNICAL FIELD

The present invention relates to an organic photoelectric conversion element which is applicable to a large sized format and excellent in durability.

BACKGROUND

In recent years, since an organic thin film solar cell which is made of an organic photoelectric element can be formed by a coating method, it hat been attracted attention as a solar cell suitable for mass production, and intensive investigation has been made in many research institutions.

The organic thin film solar cell was improved in a charge separation efficiency which had been a problem by adopting what is called a bulk hetero junction structure in which an electronic donor material and an electronic acceptor material were mixed (for example, refer to Patent document 1). In recent years, the photoelectric conversion efficiency was improved to achieve an extent of 5 to 6%, and it can be said that the investigations towards a practical application has been activated more. However, in the organic photoelectric conversion element towards a future practical application, development of the organic photoelectric conversion element which generates electricity at higher efficiency is desired.

Moreover, when manufacturing an organic thin film solar cell with a coating process using a flexible substrate, it is possible to manufacture an inexpensive solar cell with a low manufacturing cost which cannot be realized with the conventional silicone system solar cell by applying coating process so called a roll to roll process. However, for the purpose of practical realization, development of an inexpensive and highly efficient flexible transparent electrode substrate is one of the key investigational works.

Conventionally, as a transparent electrode, there has been mainly used an ITO transparent electrode having an indium-tin complex oxide (ITO) membrane produced by a vacuum deposition method or a sputtering process on transparent base materials, such as glass and a transparent plastic film. However, it was problems that the transparent electrode formed using a vacuum deposition method or sputtering process has inferior manufacturing efficiency, and the manufacturing cost is high and that it is inapplicable to the device application in which a flexible property is required since it is inferior to flexibility.

As a production method of a transparent electrode excellent in manufacturing efficiency, there is disclosed a technique using a conductive fiber like a carbon nanotube (CNT) or a metal nanowire. Here, fixing a part of a conductive fiber is fixed to a substrate with a transparent resin layer, and a part of the conductive fiber is projected on the surface of the transparent resin layer to result in forming an electrode (for example, refer to Patent documents 2 and 3). However, since the electrode of such composition has electro conductivity only in the part from which the conductive fiber is projected on the surface, it does not have a function as a flat electrode. In addition, since the conductive fiber is projected on the surface and too much resistance will be loaded on the projected part, the deterioration from a projected part will occur and this method had the problem that the durability of the whole element was inferior.

Patent document 1: U.S. Pat. No. 5,331,183
Patent document 2: Japanese Translation of PCT International Application Publication No. 2006-519712
Patent document 3: US 2007/0074316

SUMMARY

The present invention was made in view of the above-mentioned problems. An object of the present invention is to provide to an organic photoelectric conversion element containing a flexible transparent electrode substrate which can achieve a large sized format and high durability. This organic photoelectric conversion element is excellent in photoelectric conversion efficiency. An object of the present invention is also to provide a production method of the aforesaid organic photoelectric conversion element.

The above problems related to the present invention can be solved by the following embodiments.

1. An organic photoelectric conversion element comprising:
   a first electrode;
   a second electrode; and
   an organic photoelectric conversion layer sandwiched between the first electrode and the second electrode,
   wherein the first electrode comprises:
   a conductive fiber layer; and
   a transparent conductive layer containing a conductive polymer comprising a π conjugated conductive polymer and a polyanion, and an aqueous binder, and
   at least a part of the transparent conductive layer containing the conductive polymer and the aqueous binder is cross-linked therein.

2. The organic photoelectric conversion element of the aforesaid item 1,
   wherein the aqueous binder comprises Polymer (A) containing the following recurring units.

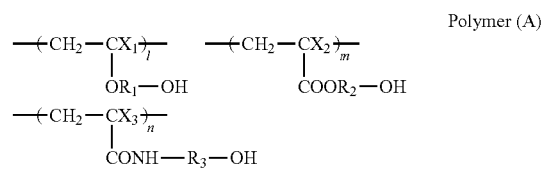

Polymer (A)

In Polymer (A), $X_1$ to $X_3$ each respectively represent a hydrogen atom or a methyl group; $R_1$ to $R_3$ each respectively represent an alkylene group having a carbon number of 5 or less; l, m and n each respectively represent a ratio of each recurring unit when the total molar number of monomers composing Polymer (A) is set to be 100, provided that l, m and n satisfy the relationship of $50 \le l+m+n \le 100$.

3. The organic photoelectric conversion element of the aforesaid items 1 or 2,
   wherein the polyanion contains a sulfo group as an anionic group.

4. The organic photoelectric conversion element of any one of the aforesaid items 1 to 3,
   wherein the conductive fiber is a metal nanowire.

5. The organic photoelectric conversion element of any one of the aforesaid items 2 to 4,
wherein the first electrode comprises:
the conductive fiber layer containing a metal nanowire; and
the transparent conductive layer containing (i) the conductive polymer comprising the π conjugated conductive polymer and the polyanion; and (ii) the aqueous binder comprising Polymer (A) containing the foregoing recurring units.
6. A method for forming an organic photoelectric conversion element comprising the steps of
coating a conductive fiber containing liquid on a substrate;
drying the coated conductive fiber containing liquid;
coating a liquid containing a conductive polymer comprising a π conjugated conductive polymer and a polyanion, and an aqueous binder comprising Polymer (A) containing the following recurring units to form a first electrode;
forming an organic photoelectric conversion layer; and
forming a second electrode.

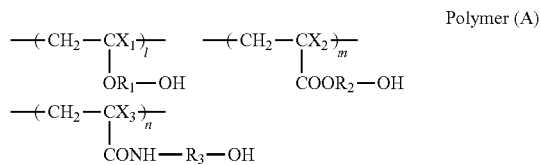

Polymer (A)

In Polymer (A), $X_1$ to $X_3$ each respectively represent a hydrogen atom or a methyl group; $R_1$ to $R_3$ each respectively represent an alkylene group having a carbon number of 5 or less; l, m and n each respectively represent a ratio of each recurring unit when the total molar number composing Polymer (A) is set to be 100, provided that l, m and n satisfy the relationship of $50 \leq l+m+n \leq 100$.
7. The organic photoelectric conversion element of any one of the aforesaid items 1 to 4,
wherein the transparent conductive layer which composes the first electrode contains conductive particles.

The present invention makes it possible to produce a flexible transparent electrode substrate exhibiting high durability. The present invention makes it possible to produce an organic photoelectric conversion element by using this flexible transparent electrode substrate which can achieve a large sized format and excellent in photoelectron conversion efficiency.

DESCRIPTION OF ME PREFERRED EMBODIMENTS

Figure 1:
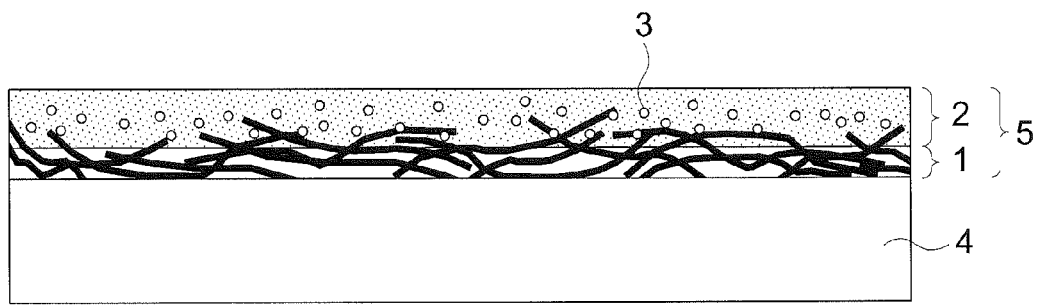
FIG. 1 is a schematic drawing which shows the structure of the first electrode of the present invention.

The present inventors investigated a transparent conductive electrode which can be produced with a coating method and to resolve the problems of improving efficiency of an organic photoelectric conversion element. As a result, the present inventors achieved the following invention. In an organic photoelectric conversion element containing on a transparent substrate a first electrode of a transparent electrode, an organic photoelectric conversion layer and a second electrode in the order near from the transparent substrate, it is possible to realize an organic photoelectric conversion element having a high photoelectric conversion efficiency by the following structure. Namely, the aforesaid first electrode comprises: a conductive fiber layer; and a transparent conductive layer containing a conductive polymer and an aqueous binder. Moreover, at least a part of the transparent conductive layer containing the conductive polymer and the aqueous binder is cross-linked. Furthermore, it was found the production method of an organic photoelectric conversion element which can reduce the production cost by producing the transparent electrode and the organic photoelectric conversion layer with a coating method. Thus, the present invention was achieved.

The present inventors guessed as follows the reason of obtaining the required effects of the present invention by taking the composition specified by the present invention.

With respect to an organic photoelectric conversion element, it is reported that a conductive fiber is used as a coated transparent electrode. However, in the electrode employing such conductive fibers, it is required that the electrode has to be formed by projecting a part of the conductive fibers from the surface of the transparent resin film. The actual situation is that there is a problem that too much resistor arises at a projection part of the aforesaid electrode to result in deterioration of the electrode, and the durability of the whole element will be fallen.

The organic photoelectric conversion element of the present invention is characterized in that the first electrode comprises: a conductive fiber layer; and a transparent conductive layer containing a conductive polymer comprising a π conjugated conductive polymer and a polyanion, and an aqueous binder, and the transparent conductive layer has a cross-linked structure inside thereof. By this transparent conductive layer, the projection consisting of conductive fibers and a foreign material can be embedded in the transparent conductive layer.

Moreover, although the details of the mechanism are unknown, even if the coating thickness is increased, the surface smoothness of the transparent conductive layer of the present invention which is made of a conductive polymer and an aqueous binder is not spoiled like a transparent conductive layer made of a non aqueous binder. It is assumed that a water soluble binder has a moderate interaction with a conductive polymer, and when a solvent volatilizes to some extent during a drying process, migration of the solid content will be prevented to form smooth membrane.

The damage to organic functional layers, such as leak between the electrodes of a device, is reduced by the above-described projection and embedding of a foreign material and smoothing of the transparent conductive layer. Further, it is thought that the durability of the whole element is improved by control of the local deterioration of the organic photoelectric conversion element.

Furthermore, in the present invention, at least a part of the transparent conductive layer containing a conductive polymer and an aqueous binder forms a cross-linked structure.

Migration of a minute impurity in a transparent conductive layer is restricted by this cross linkage. As a result, not only diffusion of the impurity in the layer is controlled, but the water fastness of the layer and solvent resistance is improved and it is possible to conduct wet cleaning of the transparent conductive layer. The impurity and the foreign material on the surface of the layer are removable with cleaning to obtain a smooth conductive layer. From the reason described above, it is thought that the durability of the organic photoelectric conversion element is improved.

Moreover, in the present invention, it was found out that the photoelectric conversion efficiency was improved more by making conductive particles further coexist in the conductive polymer layer which constitutes the first electrode. This is thought as follows. By incorporating together the particles which have a high refractive index into a conductive polymer, the optical length of an incident light becomes long by the effect of the optical locked-in effect which shuts up in an element the light which once entered in the photoelectric conversion layer. Consequently, the amount of the light which reaches the photoelectric conversion layer will be increased, and the photoelectric conversion efficiency will be improved.

[First Electrode]

In the organic photoelectric conversion element of the present invention, the first electrode becomes an anode. The first electrode comprises: a conductive fiber; a conductive polymer comprising a π conjugated conductive polymer and a polyanion; and the aforesaid aqueous binder.

A schematic drawing which shows the structure of the first electrode of the present invention is shown in FIG. 1, in which the first electrode comprises: a conductive fiber; a conductive polymer comprising a π conjugated conductive polymer and a polyanion; and the aforesaid aqueous binder. The first electrode 5 of the present invention contains on a transparent substrate 4 at least a conductive fiber layer 1 and a transparent conductive layer 2 which contains: a conductive polymer comprising a π conjugated conductive polymer and a polyanion; and an aqueous binder. The transparent conductive layer 2 contains a cross-linked structure inside thereof. A preferable structure of the transparent conductive layer 2 contains the conductive fibers located in the near side of the on transparent substrate, and the transparent conductive layer 2 is laminated so that the conductive fibers are completely embedded, and further, a transparent particle 3 is incorporated in the transparent conductive layer 2 so as to scatter the light in the transparent conductive layer 2.

The total optical transmittance of the first electrode 5 of the present invention is preferably at least 60%, it is more preferably at least 70%, but it is still most preferably at least 80%. It is possible to determine the total optical transmittance based on methods known in the art, employing a spectrophotometer. Further, the electrical resistance value of the first electrode is preferably at most 50Ω/□, it is more preferable to be at most 10Ω/□, and it is specifically preferable to be at most 13Ω/□. When an electrical resistance value of the transparent electrode exceeds 50Ω/□, photoelectric conversion efficiency may be inferior in an organic photoelectric conversion element having a large sized photo reception area. It is possible to determine the above surface resistivity, for example, based on JIS K7194: 1994 (Test method for resistivity of conductive plastics with a 4-pin probe measurement method) or ASTM D257. Further, it is also possible to conveniently determine the surface resistivity employing a commercially available surface resistivity meter.

The thickness of the transparent electrode of the present invention is not particularly limited, and it is possible to appropriately select the thickness depending on intended purposes. However, commonly the thickness is preferably at most 10 μm. The thickness is more preferably thinner since transparency and transparency are thereby improved in relation to the thickness.

[Conductive Fiber]

As a conductive fiber used for the present invention, it can be used the followings: an organic or inorganic fiber which is coated with a metal, a conductive metal oxide fiber, a metal nanowire, a carbon fiber and a carbon nanotube. Among them, a metal nanowire is preferably used.

Generally, metal nanowires indicate a linear structure composed of a metallic element as a main structural element. In particular, the metal nanowires in the present invention indicate a linear structure having a diameter of a nanometer (nm) size.

In order to form a long conductive path by one metal nanowire, a metal nanowire according to the present invention is preferably have an average length of 3 μm or more, more preferably it is 3-500 μm, and still more it is 3-300 μm. In addition, the relative standard deviation of the length of the conductive fibers is preferably 40% or less. Moreover, from a viewpoint of transparency, a smaller average diameter is preferable, on the other hand, a larger average diameter is preferable from a conductive viewpoint. In the present invention, 10-300 nm is preferable as an average diameter of metal nanowires, and it is more preferable to be 30-200 nm. Further, the relative standard deviation of the diameter is preferably to be 20% or less.

There is no restriction in particular to the metal composition of the metal nanowire of the present invention, and it can be composed of one sort or two or more metals of noble metal elements or base metal elements. It is preferable that it contains at least one sort of metal selected from the group consisting of noble metals (for example, gold, platinum, silver, palladium, rhodium, iridium, ruthenium and osmium), iron, cobalt, copper and tin. It is more preferable that silver is included in it at least from a conductive viewpoint. Moreover, for the purpose of achieving compatibility of conductivity and stability (sulfuration resistance and oxidation resistance of metal nanowire and migration resistance of metal nanowire), it is also preferable that it contains silver and at least one sort of metal belonging to the noble metal except silver.

When the metal nanowire of the present invention contains two or more kinds of metallic elements, metal composition may be different between the surface and the inside of metal nanowire, and the whole metal nanowire may have the same metal composition.

In the present invention, there is no restriction in particular to the production means of metal nanowires. It is possible to prepare metal nanowires via various methods such as a liquid phase method or a gas phase method. For example, the manufacturing method of Ag nanowires may be referred to Adv. Mater. 2002, 14, 833-837 and Chem. Mater. 2002, 14, 4736-4745; a manufacturing method of Au nanowires may be referred to JP-A No. 2006-233252; the manufacturing method of Cu nanowires may be referred to JP-A No. 2002-266007; while the manufacturing method of Co nanowires may be referred to JP-A No. 2004-149871. Specifically, the manufacturing methods of Ag nanowires, described in Adv. Mater. 2002, 14, 833-837 and Chem. Mater. 2002, 14, 4736-4745, may be preferably employed as a manufacturing method of the metal nanowires according to the present invention, since via those methods, it is possible to simply prepare a large amount of Ag nanowires in an aqueous system and the electrical conductivity of silver is highest of all metals.

In the present invention, a three-dimensional conductive network is formed by mutual contact of nanowires and high conductivity is achieved. By this, a light can penetrate the window part of the conductive network where metal nanowires do not exist, and further, it becomes possible to perform efficiently the generation of electricity by the scattering effect of the metal nanowires in the organic photoelectric conversion layer portion.

[Composition of the First Electrode Other than Metal Nanowire]

In the present invention, by allowing metal nanowires to contain in the first electrode, a scattering effect of the light by the metal nanowires is acquired. In addition, since a metal nanowire has high conductivity, it is possible to use together other materials such as a resin having a low refractive index, without degrading conductivity. It becomes possible to make the refractive index of the first electrode to be lower than that of the photoelectric conversion layer part. As a result, it is possible to restrain the reflection at each of the interfaces of the substrate, the first electrode, and the photoelectric conversion layer part, and the light can be made to effectively reach a photoelectric conversion layer part by this. In order to produce this effect effectively, it is desirable that the average refractive index of the first electrode is lower than the average refractive index of the photoelectric conversion layer part.

Although the first electrode of the present invention contains metal nanowires, in order to hold the metal nanowires, it is preferable to use together a certain transparent resin, or a transparent inorganic material. What is necessary is just to choose a material suitably so that the above-mentioned requirement for refractive index may be satisfied. Such material is not specifically limited. Examples of the material include: a polyester resin, a polystyrene resin, an acrylic resin, a polyurethane resin, an acrylic urethane resin, a polycarbonate resin, a cellulose resin and a butyral resin. These can be used solely, or can be used in combination of two or more. Moreover, it may be a UV curable resin.

[Particles]

In the present invention, by allowing metal nanowires to contain in the first electrode, a scattering effect of the light by the metal nanowires is acquired. In addition, since a metal nanowire has high conductivity, it is possible to use together a second transparent component such as particles or a resin having a low refractive index, without degrading conductivity. It becomes possible to make the refractive index of the first electrode part higher than the photoelectric conversion layer part by this. And, it becomes possible to effectively confine the light in the first electrode part by the synergistic effects of these elements.

In order to produce this effect effectively, it is required that the average refractive index of the first electrode part to be higher than the average refractive index of the organic photoelectric conversion layer part. As such a second transparent component, a transparent conductive metal oxide can be used preferably. It becomes possible to turn on electricity also to the minute area of a window part where the metal nanowire does not exist by using a conductive polymer or a transparent conductive metal oxide, and it becomes possible to make it function as an almost perfect flat electrode. In order to function as an almost perfect flat electrode, it is required that the conducting material itself has a surface resistance to be $10^{10}\Omega/\square$ or less, and more it is preferably to be $10^{8}\Omega/\square$ or less.

As a transparent conductive metal oxide, there can be cited a metal oxide particle, a composite metal oxide particle, a composite metal oxide particle doped, or a metal oxide sol thereof, such as: $ZrO_2$, $CeO_2$, $ZnO$, $TiO_2$, $SnO_2$, $Al_2O_3$, $In_2O_3$—$SiO_2$, $MgO$, $BaO$, $MoO_2$, and $V_2O_5$. Among them, the following are preferably used from a viewpoint of conductivity or transparency, a particle or a sol of: indium oxide doped with tin or zinc (ITO and IZO); zinc oxide doped with aluminium or gallium (AZO and GZO); and tin oxide doped with fluorine, or antimony (FTO and ATO). Although these may be used solely, they may use together with other resin components.

A particle diameter is preferably from 0.05 to 5 µm, more preferably from 0.05 to 2 µm. When it is less than 0.05 µm, the effect of scattering or refracting light is small. And when it is larger than 5 µm, the surface smoothness will become a problem. The refractive index of the particles is preferably from 1.7 to 3.0, and it is more preferably from 1.75 to 2.3. Within this range, the component which scatters the light in the back direction will be large, and the light confining efficiency can be improved with suppressing decrease in transmittance.

[Conductive Polymer]

A conductive polymer of the present invention is a polymer comprising a π conjugated conductive polymer and a polyanion (a poly anion). This conductive polymer can be easily produced by chemically oxidized polymerization of a later described precursor monomer which forms a it conjugated conductive polymer by a suitable oxidizing agent and an oxidation catalyst under the existence of a later described polyanion.

(II Conjugated Conductive Polymer)

The π conjugated conductive polymer used in the present invention is not particularly limited. It can be used the following chain conductive polymers: polythiophene (including the basic polythiophene, it is the same as that of the following), polypyrrole, polyindole, polycarbazole, polyaniline, polyacethylene, polyfuran, polyparaphenylene vinylelene, polyazulene, polyparaphenylene, polyparaphenylene sulfide, polyisothianaphthene and polythiazyl. Among them, polythiophene and poly aniline are preferable from the viewpoints of conductivity, clarity and stability. Polyethylene dioxythiophene is most preferable.

(II Conjugated Conductive Polymer Precursor Monomer)

A precursor monomer is a compound having a π conjugated system in the molecule and forms also a π conjugated system in the main chain of a polymer when it is polymerized by action of a suitable oxidizing agent.

Specific examples of a precursor monomer include: pyrrole, 3-methylpyrrole, 3-ethylpyrrole, 3-n-propylpyrrole, 3-butylpyrrole, 3-octylpyrrole, 3-decylpyrrole, 3-dodecylpyrrole, 3,4-dimethylpyrrole, 3,4-dibutylpyrrole, 3-carboxylpyrrole, 3-methyl-4-carboxyl pyrrole, 3-methyl-4-carboxyethyl pyrrole, 3-methyl-4-carboxybutylpyrrole, 3-hydroxypyrrole, 3-methoxypyrrole, 3-ethoxypyrrole, 3-butoxypyrrole, 3-hexyloxypyrrole, 3-methyl-4-hexyloxypyrrole, thiophene, 3-methylthiophene, 3-ethylthiophene, 3-propylthiophene, 3-butylthiophene, 3-hexylthiophene, 3-heptylthiophene, 3-octylthiophene, 3-decylthiophene, 3-dodecylthiophene, 3-octadecylthiophene, 3-bromothiophene, 3-chlorothiophene, 3-iodothiophene, 3-cyanothiophene, 3-phenylthiophene, 3,4-dimethylthiophene, 3,4-dibutylthiophene, 3-hydroxythiophene, 3-methoxythiophene, 3-ethoxythiophene, 3-butoxythiophene, 3-hexyloxythiophene, 3-heptyloxythiophene, 3-octyloxy thiophene, 3-decyloxythiophene, 3-dodecyloxythiophene, 3-octadecyloxythiophene, 3,4-dihydroxythiophene and 3,4-dimethoxythiophene, 3,4-diethoxthiophene, 3,4-dipropoxythiophene, 3,4-dibutoxythiophene, 3,4-dihexyloxythiophene, 3,4-diheptyloxythiophene, 3,4-dioctyloxythiophene, 3,4-didecyloxythiophene, 3,4-didodecyloxy thiophene, 3,4-ethylenedioxythiophene, 3,4-propylenedioxythiophene, 3,4-butenedioxythiophene, 3-methyl-4-methoxythiophene, 3-methyl-4-ethoxythiophene, 3-carboxythiophene, 3-methyl-4-carboxythiophene, 3-methyl-4-carboxyethyl thiophene, 3-methyl-4-carboxybutylthiophene, aniline, 2-methylaniline, 3-isobutylaniline, 2-aniline sulfonic acid, 3-aniline sulfonic acid.

(Polyanion)

Examples of a polyanion include: a substituted or unsubstituted polyalkylene, polyalkenylene, polyimide, polyamide, polyester and copolymer thereof. A polyanion is composed of a composing unit having an anionic group and a composing unit without having an anionic group.

This polyanion is a solubilizing polymer which makes a $\pi$ conjugated conductive polymer to solubilize in a solvent. Moreover, the anionic group of the polyanion functions as dopant to the $\pi$ conjugated conductive polymer, and improves the conductivity and heat resistance of the $\pi$ conjugated conductive polymer.

The anionic group of a polyanion should just be a functional group which enables chemical oxidation dope to the $\pi$ conjugated conductive polymer. Especially, from the viewpoints of ease of production and stability, a mono substituted sulfate group, a mono substituted phosphate group, a phosphate group, a carboxyl group and a sulfo group, are preferable. Furthermore, a sulfo group, a mono substituted sulfate group and a carboxyl group are more preferable from the viewpoint of the doping effect to the $\pi$ conjugated conductive polymer of a functional group.

Especially, a sulfo group is preferable.

Specific examples of an polyanion include: polyvinyl sulfonic acid, polystyrene sulfonic acid, polyallyl sulfonic acid, ethyl polyacrylate sulfonic acid, butyl polyacrylate sulfonic acid, poly-2-acrylamide-2-methylpropane sulfonic acid, polyisoprene sulfonic acid, polyvinyl carboxylic acid, polystyrene carboxylic acid, polyallyl carboxylic acid, polyacryl carboxylic acid, polymethacryl carboxylic acid, poly-2-acrylamide-2-methylpropane carboxylic acid, polyisoprene carboxylic acid and polyacrylic acid.

These may be a homopolymer, or they may be a copolymer of two or more sorts.

It may be a polyanion containing a fluorine atom in the molecule. Specific examples are cited as: Nafion™ which contains perfluoro sulfonic acid (made by DuPont Co., Ltd.) and Flemion™ composed of perfluoro vinyl ether containing a carboxylic acid (made by Asahi Glass Co., Ltd.).

Among them, a compound containing a sulfonic acid is preferable, since when heat-treatment is performed for 5 minutes or more at a temperature of 100° C. to 200° C. after forming the layer by applying and drying a conductive polymer containing layer using a compound which has a sulfonic acid, the cleaning resistance and solvent resistance of this coated layer will be improved remarkably.

Further, polystyrene sulfonate, polyisoprene sulfonic acid, ethyl polyacrylate sulfonic acid, and butyl polyacrylate sulfonic acid are preferable among them. These polyanions have high compatibility with an aqueous binder, and conductivity of the obtained conductive polymer can be made higher.

The degree of polymerization of a polyanion is preferably in the range of 10 to 100,000 monomer units, and it is more preferably in the range of 50 to 100,000 monomer units from the viewpoint of solvent solubility and conductivity.

As a production method of a polyanion, the following methods can be cited, for example: a method in which an anion group is directly introduced in a polymer which does not have an anion group using an acid; a method in which sulfonation is carried out to a polymer which does not have an anion group using a sulfonation agent; and a method in which polymerization is carried out using a polymerizable monomer containing an anion group.

One of methods in which polymerization is carried out using a polymerizable monomer containing an anion group is as follows. A polymerizable monomer containing an anion group is subjected to an oxidation polymerization or a radical polymerization under existence of an oxidizing agent and/or a polymerization catalyst in a solvent. Specifically, a predetermined amount of polymerizable monomer containing an anion group is dissolved in a solvent, and the mixture is kept at a constant temperature. To the mixture is added a solution which dissolved a predetermined amount of oxidizing agent and/or polymerization catalyst in a solvent beforehand. The mixture is made to react during a predetermined time. The polymer obtained by this reaction is adjusted to a fixed concentration by the solvent. In this production method, it is possible to carry out copolymerization of a polymerizable monomer containing no anion group with a polymerizable monomer containing an anion group.

An oxidizing agent, an oxidation catalyst and a solvent used for polymerization of a polymerizable monomer containing an anion group are the same as used in polymerization of a precursor monomer to form a $\pi$ conjugated conductive polymer.

When the obtained polymer is a polyanion salt, it is preferable to modify it to a polyanion acid. As a method of modify to a polyanion acid, an ion exchange method using ion-exchange resin, dialysis and ultrafiltration are cited. Among them, ultrafiltration is preferable from the viewpoint of easy operation.

A commercially available conductive polymer can be also preferably used.

Examples of a commercially available conductive polymer include: a conductive polymer composed of poly (3,4-ethylenedioxythiophene) and polystyrene sulfonic acid (PEDOT-PSS in Clevios™ series, made by H. C. Starck Co., Ltd.), PEDOT-PSS 483095 and 560596 (made by Aldrich Co., Ltd.), Denatron™ series (made by Nagase Chemtex Co., Ltd.). In addition, a polyanion is commercially available as ORMECON series (made by Nissan Chemical Industries, Ltd.). In the present invention, these compounds can be also preferably used.

It may be used a water-soluble organic compound as a second dopant. A water-soluble organic compound which can be usable in the present invention is not particularly limited, and it can be selected from publicly known compounds. For example, an oxygen atom containing organic compound is preferably cited. As an oxygen atom containing organic compound, there is no specific limitation as long as it contains an oxygen atom in the molecule. Examples thereof are: a hydroxyl group containing compound, a carbonyl group containing compound, an ether group containing compound and a sulfoxide group containing compound. Examples of the aforesaid hydroxyl group containing compound include: ethylene glycol, diethylene glycol, propylene glycol, trimethylene glycol, 1,4-butanediol and glycerin. Among these, ethylene glycol and diethylene glycol are preferable. Examples of the aforesaid carbonyl gaup containing compound include: isophorone, propylene carbonate, cyclohexanone and γ butyrolactone. An example of the aforesaid ether group containing compound includes diethylene glycol monoethyl ether. An example of the aforesaid sulfoxide group containing compound includes dimethyl sulfoxide. Although these may be used solely and two or more compounds may be used together, it is preferable to use at least one compound chosen from dimethyl sulfoxide, ethylene glycol and diethylene glycol.

[Aqueous Binder]

An aqueous binder of the present invention forms a transparent conductive layer with a conductive polymer. At least a part of the transparent conductive layer concerning the present invention is cross-linked. In the present invention, "a part of the transparent conductive layer concerning the present invention is cross-linked" indicates the both cases where a part of the aqueous binder takes the structure of cross linkage, and the aqueous binder and the conductive polymer take the structure of cross linkage. In the present invention, the effect of the present invention is produced by any one of the two cases. Migration of a minute impurity in the transparent conductive layer is restricted by this, diffusion of the impurity in the layer is controlled, and the durability against inhibition of the organic photoelectric conversion is improved.

Although the details of the mechanism are unknown, even if the coating thickness is increased, the surface smoothness of the transparent conductive layer of the present invention which is made of a conductive polymer and an aqueous binder is not spoiled like a transparent conductive layer made of a non aqueous binder. From this result, the lifetime and the keeping stability of an organic photoelectric conversion element are improved.

In the present invention, an aqueous binder is preferably a polymer matrix resin which can be dissolved or can be dispersed in an aqueous solvent. Here, an aqueous binder represents a solvent containing water in an amount of 50 weight % or more. It may be pure water. As an ingredient other than water, although it is not particularly limited if it is a solvent which is compatible with water, an alcoholic solvent is preferably used.

Further, in the present invention, an aqueous binder contains a reactive group which reacts with a conductive polymer, the aqueous binder itself or the cross-linking agent mentioned later. Various resins can be used as these aqueous binders. Examples of the resins include: a polyester resin, an acrylic resin, a polyurethane resin, an acrylic urethane resin, a polycarbonate resin, a cellulose resin and a polyvinyl acetal system resin. These can be used solely, or can be used in combination of two or more compounds. Although the reactive groups are not limited to the followings, it is enough to have a reactive group such as such as a hydroxyl group, a carboxyl group, and an amide group, for example. Among them, a resin having a hydroxyl group is specifically preferable.

At least a part of the aqueous binder will form cross-linkage with a conductive polymer or with the aqueous binder itself. Therefore, the cross-linking agent of the aqueous binder may be incorporated in the transparent conductive layer. The cross-linking agent is not specifically limited as long as it is compatible with the binder resin and it forms cross linkage. As a cross-linking agent, it can be used, for example, an oxazoline cross-linking agent, a carbodiimide cross-linking agent, an isocyanate cross-linking agent, an epoxy cross-linking agent, a melamine cross-linking agent and a formaldehyde cross-linking agent. These can be used solely or can be used in combination of plural compounds.

Among these cross-linking agents, especially, an epoxy cross-linking agent, a melamine cross-linking agent and an isocyanate cross-linking agent can be preferably used.

An epoxy cross-linking agent is a compound which has two or more epoxy groups in the molecule. Examples thereof are: Denacol™ EX313, EX614B, EX521, EX512, EX1310, EX1410, EX610U, EX212, EX622, EX721 (made by Nagase ChemteX Co., Ltd.).

A melamine cross-linking agent is a compound which has two or more methylol groups in the molecule. An example thereof is hexamethylol melamine. Examples of commercially available melamine cross-linking agents include: Beckamine™ M-3, FM-180, NS-19 (made by DIC Co., Ltd.).

An isocyanate cross-linking agent a compound which has two or more isocyanate groups in the molecule. Examples thereof are: toluene diisocyanate, xylene diisocyanate and 1,5-naphthalene diisocyanate. It can be used commercially available isocyanates such as Sumijule™ N3300 (made by Sumitomo Beyer Urethan; Co. Ltd.), Colonate™ L, Millionate™ MR-400 (made by Nippon Polyurethane Industry Co., Ltd.).

As a cross-linking structure in the transparent conductive layer, it is preferable that an aqueous binder and a conductive polymer take a cross-linking structure. In this case, a cross-linking structure can be introduced into the inner portion of a transparent conductive layer, without using a cross-linking agent independently.

Especially, when an anionic component in the conductive polymer is a polyanion having a plurality of sulfonic acid groups, and the reactive group of the above-mentioned aqueous binder has a hydroxyl group (OH group), the anion component of the conductive polymer and the reactive group of the aqueous binder will form cross-linkage. The conductive polymer having a polyanion acid, for example, a commercially available conductive polymer PEDOT-PSS, contains a polyanion containing a sulfonic acid as a dopant. Since, the aqueous solution thereof exhibits a strong acidic pH value (pH 1 to 3), of it will act as an acid catalyst and will react with the aqueous binder to cross-link each other. The conductive polymer will be stabilized by this and the dissociation will be suppressed. As a result, the lifetime of the organic electronic device will be extended and it is desirable. Furthermore, if the anionic component of the conductive polymer is a sulfonic acid group and the polymer-matrix resin which takes the structure like the above-mentioned Polymer (A) is used as an aqueous binder, the Polymer (A) will be effective to assist conductivity, and the conductivity and the transparency of a transparent conductive layer will not be spoiled.

In the present invention, cross linkage is formed as follows. In a part of a hydroxyl group contained in the aqueous binder as a reactive group, an ether linkage can be formed and a bridge can be constructed in a polymer molecule because OH groups of a hydrophilic polymer are subjected to dehydration, since the conductive polymer is strongly acidic when the conductive polymer has a polyanion which has a sulfonic acid group, and the polyanion serves as a catalyst for dehydration. It is also preferable to perform heat-treatment.

The above-described cross linkage can be measured by the change of the glass transition temperature of the transparent conductive layer, the change of a nanoindentation elastic modulus, or further, the change of the functional group through FT-IR measurement. Furthermore, when a sulfonic acid group exists, a sulfonic acid group and the reactive group in the aqueous binder will be jointed together to be stabilized, and dissociation of a sulfonic acid group can be suppressed.

According to these, compared with the use of a crosslinking agent, a bridge can be precisely constructed in the layer without adding an additive. It is a preferable method because there will be no deteriorate effect caused by unreacted or deactivated reagent.

In the present invention, in order to advance the above-mentioned cross linkage reaction, it is desirable to early out heat-treatment as an additional treatment. As requirements for heat treatment, although it depends on a reagent, it is preferable to additionally heat for 5 minutes or more for example at a temperature of 100° C. to 200° C. As an operating temperature, it is more preferable to heat at 110° C. to 160° C., and as a processing time it is more preferable to heat for 15 minutes or more. Although there is no upper limit in particular of a processing time, it is preferable that it is 120 minutes or less by considering manufacturing efficiency.
(Polymer (A))

Polymer (A) is a compound containing the monomers represented with the following monomers 1 to 3 as main copolymerization components. The Polymer (A) is a copolymer in which any one of the monomers 1 to 3 occupies 50 mol % or more, or a sum of the monomers 1 to 3 occupies 50 mol % or more. The sum of the monomers 1 to 3 is more preferably 80 mol % or more. Further, the Polymer (A) may be a homopolymer made of any single one of the following monomers 1 to 3. This is also one of the preferable embodiments.

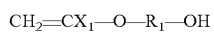  Monomer 1:

  Monomer 2:

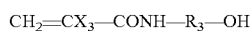  Monomer 3:

In the formulas, $X_1$, $X_2$, $X_3$, $R_1$, $R_2$ and $R_3$ each represent the same groups as represented by $X_1$, $X_2$, $X_3$, $R_1$, $R_2$ and $R_3$ of the aforesaid Polymer (A).

In Polymer (A), although copolymerization of other monomer components may be carried out, it is more preferable that it is a high hydrophilic monomer component.

It is preferable that Polymer (A) contains a component having a number average molecular weight of 1,000 in an amount of 0 to 5% or less. It can be improved the stability of the device and it can be reduced the behavior of a barrier perpendicularly to the transparent layer at the time of exchanging an electric charge perpendicularly to a transparent conductive layer because there are only a small amount of low molecular weight ingredients.

As an example of Monomer 1,2-hydroxyethyl vinyl ether can be cited. As an example of Monomer 2, hydroxyethyl (meth)acrylate can be cited. As an example of Monomer 3, N-(hydroxymethyl)(meth)acrylamide and N-(hydroxyethyl) (meth)acrylamide can be cited.

To reduce a content of the component having the number average molecular weight of 1,000 in an amount of 0 to 5% or less in this Polymer (A), there are the following methods. That is, there can be used: a method of removing a low molecular weight component by a precipitation method or a preparative GPC after preparing a monodispersed polymer with a living polymerization; or a method of controlling formation of a low molecular weight component can be used again. The reprecipitation method is a method of: dissolving a polymer in a solvent which can dissolve the polymer; dropping the polymer solution into a low soluble solvent to precipitate the polymer and to remove low molecular weight components such as a monomer, a catalyst, and an oligomer, from the solvent. The preparative GPC is a method which enables to remove the required low molecular weight components by using for example, a recycle preparative GPC LC-9100 (made by Japan Analytical Industry, Co., Ltd.), in which the solution dissolved the polymer can be divided according to the molecular weights by passing the solution in a polystyrene gel column. In living polymerization, formation of an initiator will be unchanged over reaction time, and there are few side reactions, such as a cessation reaction, and a polymer having a uniform molecular weight can be obtained. Since the molecular weight can be adjusted by the amount of the added monomer, if a polymer having a molecular weight of, 20,000, for example, is prepared, it can control formation of a low molecular weight component. The reprecipitation method and the living polymerization method are preferable from manufacturing aptitude.

The measurement of the number average molecular weight and the weight average molecular weight off an aqueous binder of the present invention can be done by generally known gel permeation chromatography (GPC). The molecular weight distribution can be represented with the ratio of (a weight average molecular weight/a number average molecular weight). There is no restriction in particular to a solvent for measurement as long as an aqueous binder is dissolved in the solvent to be used. THF, DMF and $CH_2Cl_2$ can be can be preferably used, THF and DMF can be more preferably used, and DMF can be still more preferably used. Moreover, although there is no a restriction in particular to a measurement temperature, it is preferable to measure at 40 degrees ° C.

The number average molecular weight of Polymer (A) of the present invention is preferably in the range of 3,000 to 2,000,000. More preferably, it is in the range of 4,000 to 500,000, and still more preferably, it is in the range of 5,000 to 100,000.

The molecular weight distribution of Polymer (A) of the present invention is preferably in the range of 1.01 to 1.30, and more preferably, it is in the range of 1.01 to 1.25.

A content of components having a number average molecular weight of 1,000 or less was determined by integrating the area of a number average molecular weight of 1,000 or less in the distribution acquired by GPC, and by dividing the obtained area by the area of the whole distribution.

Although there is no restriction in particular to the solvent for the living radical polymerization, as long as it is inert under the reaction conditions, and it ca dissolve the monomer and the produced polymer, a mixed solvent of an alcohol solvent and water is preferable. Although the temperature of the living radical polymerization changes with the initiators to be used, generally, it is carried out at minus 10 to 250° C., preferably it is carried out at 0 to 200° C., more preferably it is carried out at 10 to 250° C.

The ratio of a conductive polymer to Polymer (A) is preferably as follows: when a conductive polymer is 100 weight parts, Polymer (A) is set to be from 30 weight parts to 900 weight parts. It is more preferable from the viewpoints of the prevention of leak, the conductive assisting effect of the Polymer (A), and transparency that the Polymer (A) is set to be 100 weight parts or more.

[Transparent Conductive Layer]

In the present invention, it becomes possible to embed a conductive fiber in a transparent conductive layer by having a transparent conductive layer between the conductive fiber which forms the first electrode, and an organic functional layer. Moreover, by smoothing the electrode, it can reduce the resistance which is loaded on a local position of the electrode, and it is thought that the durability of an organic photoelectric conversion element is improved.

In the present invention, a transparent conductive layer is characterized in that it is formed by coating the mixed liquid which contains at least a conductive polymer and an aqueous binder on the first transparent electrode and drying. Moreover, the concentration of the solid content in the coating solution is preferably from 0.5 weight % to 30 weight %, and it is more preferably from 1 weight % to 20 weight % from the viewpoints of the standing stability of the liquid, the surface smoothness of the coated liquid and exhibition of a leak preventive effect.

As a coating method, there can be employed the method of a roller coating method, a bar coating method, a dip coating method, a spin coating method, a casting method, a die coating method, a blade coating method, a gravure coating method, a curtain coating method, a spray coating method, and a doctor coating method, a letterpress (typographic) printing method, a porous (screen) printing method, a lithographic (offset) printing method, an intaglio (gravure) printing, a spray printing method and an ink-jet printing method.

The dried layer thickness of the transparent conductive layer is preferably from 30 nm to 2,000 nm. It is more preferably 100 nm or more, since the decrease of the conductivity becomes large when it is less than 100 nm. And from the viewpoint of increasing further a leak preventive effect, it is still more preferable to be 200 nm or more. In order to maintain a high transparency, it is more preferably 1,000 nm or less.

After coating, a dry process is performed suitably. Although there is no restriction in particular as requirements for a dry process, it is preferable to carry out a dry process in the temperature range where neither a substrate material nor a conductive polymer containing layer receives damages. For example, the dry process can be carried out at 80 to 150° C. for 10 seconds to 30 minutes.

When the polyanion is a compound containing a sulfonic acid group, it is preferable to perform heat-treatment at a temperature of 100° C. to 200° C. for 5 minutes or more after forming the layer by applying and drying a conductive polymer containing layer. By this heat-treatment, the cleaning resistance and solvent resistance of the transparent conductive layer will be improved remarkably. In addition, the keeping stability is also improved. At less than 100° C., an effect is small, and also when exceeding 200° C., an effect becomes small probably due to increase of another reaction. The operating temperature is more preferably from 110° C. to 160° C., and the processing time is more desirably 15 minutes or more. Although there is no upper limit in particular to a processing time, but by considering manufacturing efficiency, it is preferable to be 120 minutes or less.

The surface treatment may be performed to the transparent conductive layer in order to secure the wettability. A well-known technique can be used as a surface treatment. Examples thereof include: corona discharge treatment, flame treatment, ultraviolet treatment, high-frequency wave treatment, glow discharge process, active plasma treatment and laser treatment.

(Patterning Method)

The first electrode concerning the present invention may be patterned. There is no restriction in particular to the method and process of patterning, and a well-known approach can be applied suitably. For example, after forming the patterned layer containing a metal nanowire, a conductive polymer, and a transparent conductive metal oxide on the mold-releasing surface, then by transferring the aforesaid layer onto a transparent substrate, the patterned transparent electrode can be obtained. Specifically, the following methods can be preferably used.

(i) The method in which a layer containing a metal nanowire, a conductive polymer and an aqueous binder is directly built in a pattern by using a printing method on a mold-releasing substrate.

(ii) The method in which a layer containing a metal nanowire, a conductive polymer, an aqueous binder and a transparent conductive metal oxide is uniformly built on a mold-releasing substrate, then pattering is carried out using the general photolithographic process.

(iii) The method in which a UV curable resin, a layer containing a metal nanowire, a conductive polymer, an aqueous binder and a transparent conductive metal oxide is uniformly built on a mold-releasing substrate, then pattering is carried out using a photolithographic process.

(iv) The method in which a layer containing a metal nanowire, a conductive polymer, an aqueous binder and a transparent conductive metal oxide is uniformly built a negative pattern using a photoresist which has been provided on a mold-releasing substrate, then patterning is carried out using a lift off method.

By using any one of the above-mentioned methods, the patterned transparent electrode can be formed by transferring the patterned layer containing a metal nanowire, a conductive polymer, an aqueous binder and a transparent conductive metal oxide produced on the mold-releasing substrate onto a transparent substrate.

(Compositions of Organic Photoelectric Conversion Element and Solar Cell)

Figure 2:
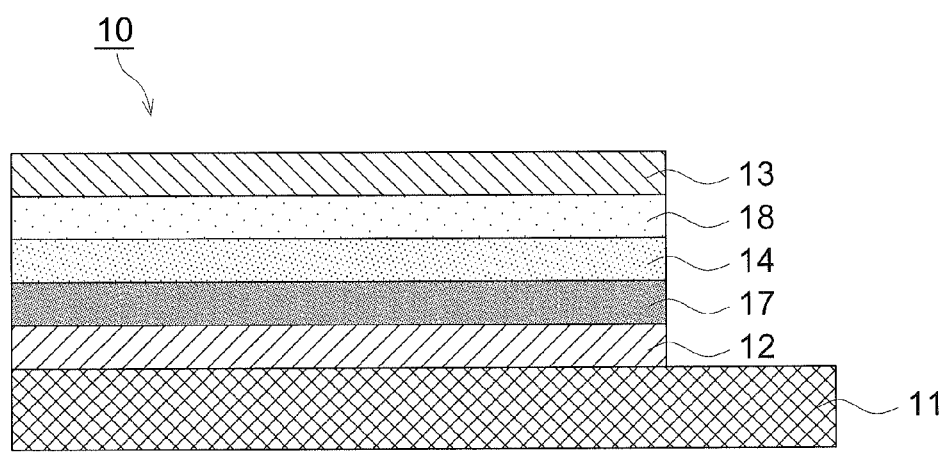
FIG. 2 is a cross-sectional view showing a solar cell having an organic photoelectric conversion element of a bulk heterojunction type.

FIG. 2 is a cross-sectional view showing an example of a solar cell having an organic photoelectric conversion element of a bulk heterojunction type. In FIG. 2, an organic photoelectric conversion element 10 of a bulk heterojunction type has a successively laminated structure on one surface of a substrate 11: a anode 12, a positive hole transport layer 17, a photoelectric conversion layer 14 of a bulk heterojunction type, an electron transport layer 18 and a cathode 13.

The substrate 11 is a member holding successively laminated members of the anode 12, the photoelectric conversion layer 14 and the cathode 13. In this embodiment, since the incident light by which photoelectric conversion is carried out enters from the substrate 11 side, the substrate 11 is a member which enables to pass through this light by which photoelectric conversion is carried out, i.e., it is a transparent member to the wave length of this light that should be carried out photoelectric conversion. As for the substrate 11, a glass substrate and a resin substrate are used, for example. This substrate 11 is not indispensable. For example, the organic photoelectric conversion element 10 of a bulk heterojunction type may be formed by forming the anode 12 and the cathode 13 on both surfaces of the photoelectric conversion layer 14.

The photoelectric conversion layer 14 is a layer which converts light energy into electric energy, and it is composed of a bulk heterojunction layer uniformly mixed with a p-type semiconductor material and an n-type semiconductor material. A p-type semiconductor material functions relatively as an electron donor (donor), and an n-type semiconductor material functions relatively as an electron acceptor (acceptor). Here, an electron donor and an electron acceptor are "an electron donor and an electron acceptor which form a pair of electron and positive hole (charge separation state) by transfer of an electron from an electron donor to an electron acceptor when a light is absorbed." That is, an electron is not donated or received like an electrode, but an electron is donated or received by a photoreaction.

In FIG. 2, the incident light entering to the anode 12 through the substrate 11 is absorbed by an electron donor or an electron acceptor in the bulk heterojunction layer of the photoelectric conversion layer 14. An electron is transferred from the electron donor to the electron acceptor to form a pair of electron and positive hole (charge separation state). The generated electric charge is transported by an internal electric field, for example, the electric potential difference of the anode 12 and the cathode 13 when the work function of the anode 12 and the cathode 13 are different. An electron passes through electron acceptors, while a positive hole passes through electron donors, and the electron and the positive hole each are respectively transported to a different electrode, and a photocurrent is detected. For example, when the work function of the anode 12 is larger than the work function of the cathode 13, the electron is transported to the anode 12 and the positive hole is transported to the cathode 13. In addition, if the size of a work function is reversed, the electron and the positive hole will be transported to the reverse direction to that described above. Moreover, the transportation direction of an electron and a positive hole is also controllable by applying a potential between the anode 12 and the cathode 13.

In addition, although not described in FIG. 2, it may possible to have other layers, such as a positive hole block layer, an electron block layer, an electron injection layer, a positive hole injection layer, or a smoothing layer.

Figure 3:
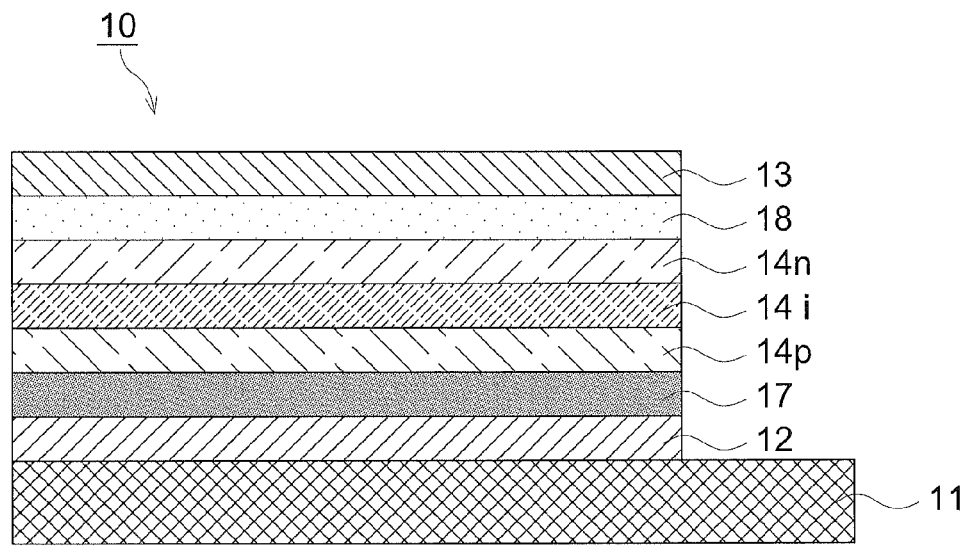
FIG. 3 is a cross-sectional view showing a solar cell having an organic photoelectric conversion element provided with tandem type bulk heterojunction photoelectric conversion layers.

More preferable structure is a structure in which the above-mentioned photoelectric conversion layer 14 is composed of three layered structure of so-called p-i-n structure (FIG. 3). The usual bulk heterojunction layer is a single layer 14$i$ containing a p-type semiconductor material and an n-type semiconductor material mixed with each other. By sandwiching the 14$i$ layer with a 14$p$ layer composed of a p-type semiconductor material single substance and a 14$n$ layer composed of an n-type semiconductor material single substance, the rectifying property of a positive hole and an electron becomes higher, the loss caused by the recombination of a positive hole and an electron which carried out charge separation is reduced, and still higher photoelectric conversion efficiency can be acquired by this structure.

Figure 4:
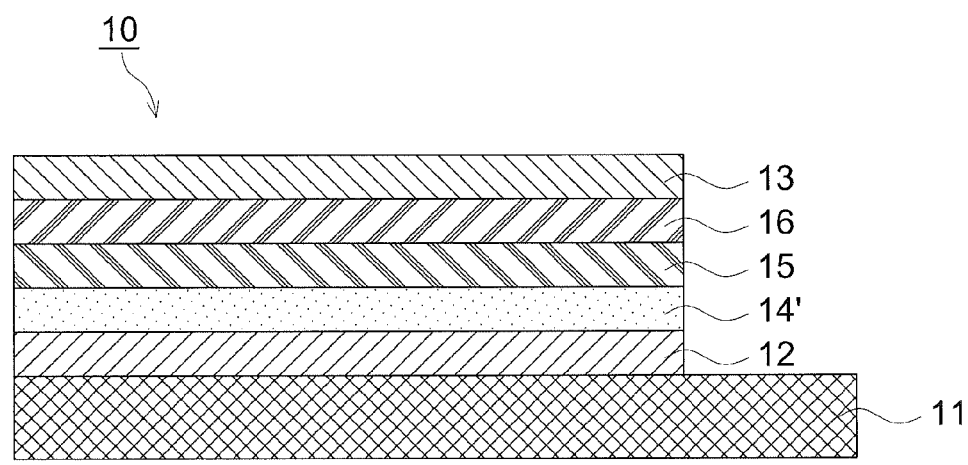
FIG. 4 is a cross-sectional view showing a solar cell having an organic photoelectric conversion element provided with tandem type bulk heterojunction photoelectric conversion layers.

Furthermore, it is also possible to make a tandem type structure produced by laminating a plurality of the aforesaid photoelectric conversion elements for the purpose of improving a sunlight utilization factor (photoelectric conversion efficiency). FIG. 4 is a cross-sectional view showing a solar cell having an organic photoelectric conversion element containing bulk heterojunction layers of a tandem type. A tandem type structure can be made as follows. After laminating the anode 12 and the first photoelectric conversion layer 14' successively on the substrate 11, a charge recombination layer 15 is laminated. Then, a second photoelectric conversion layer 16 and the cathode 13 are laminated to achieve a tandem type structure. The second photoelectric conversion layer 16 may be a layer which absorbs the same spectrum as an absorption spectrum of the first photoelectric conversion layer 14', or it may be a layer which absorbs a different spectrum. Preferably, the second photoelectric conversion layer 16 absorbs a different spectrum from that of the first photoelectric conversion layer 14'. Moreover, both the first photoelectric conversion layer 14' and the second photoelectric conversion layer 16 may be three layered lamination structure of p-i-n as mentioned above.

(Electron Block Layer (EBL))

As a material used for an electron block layer, an electron-donative organic material can be used preferably. It is possible to use a compound If it has a sufficient electron block property, even if it is not an electron-donative compound. Here, an electron block property is achieved by having a shallower LUMO level than the LUMO level of then type semiconductor material used for a photoelectric conversion layer. For this reason, the electron generated in the photoelectric conversion layer is not conveyed to the first electrode side, as a result, it can achieve an element which shows an excellent rectifying characteristic. Such a rectifying characteristic is also called en electron block ability.

With respect to the energy difference between the LUMO level of then type semiconductor material used in the aforesaid photoelectron conversion layer and the LUMO level of the material which forms the electron block layer, it is preferable for the embodiment of the present invention that the electron block layer has a shallower LUMO level than that of then type semiconductor material by 0.5 eV or more. More preferably, it is shallower by 1.0 eV, and still more preferably, it is shallower by 1.5 eV.

Here, distinction of the material which can be preferably used for an electron block layer and the material which can be preferably used for a positive hole transporting layer is mainly judged from the magnitude of the thickness dependency to the series resistance of an element. Especially, although the material preferably used for an electron block layer excels in an electron block ability because there are few intermediate levels (an internal-defect level and an impurity level) between a HOMO level and a LUMO level, generally, the series resistance of an element will be extremely increased depending on the coating thickness when it becomes thick.

Examples of the aforesaid materials are: an aromatic diamine and a derivative thereof such as N,N'-bis(3-methylphenyl)-(1,1'-biphenyl)-4,4'-diamine (TPD) and 4,4'-bis[(N-(naphthyl)-N-phenylamino)]biphenyl (α-NPD), oxazole, oxadiazole, triazole, imidazole, imidazolone, a stilbene derivative, a pyrazoline derivative, tetrahydroimidazole, poly arylalkane, butadiene, 4,4',4''-tris(N-(3-methylphenyl)N-phenylamino)triphenylamine (m-MTDATA), a porphiline compound such as porphin, tetraphenylporphin copper, phthalocyanine, copper phthalocyanine and titanium phthalocyanine oxide, a triazole derivative, an oxadiazolederivative, an imidazole derivative, a poly arylalkane derivative, a pyrazoline derivative, a pyrazolone derivative, a phenylenediamine derivative, an anilamine derivative, an amino substituted chalcone, an oxazole derivative, a styrylanthracene derivative, a fluorenone derivative, a hydrazone derivative and a silazane derivative. As a polymeric material, it can be preferably used polymers made of phenylene vinylene, fluorene, carbazole, indole, pyrene, pyrrole, picoline, thiophene, acetylene, and diacetylene and a derivative thereof.

The coating thickness range of an electron block layer is preferably from 0.5 nm to 20 nm, it is more preferably from 1.5 nm to 10 nm, and it is still more preferably from 1 nm to 10 nm. If it is 0.5 nm or more, the coating thickness can be obtained stably, and if it is less than 20 nm, since it can fully suppress the increase of the series resistance of an element, it is one of the preferred embodiments of the present invention.

(Positive Hole Transporting Layer (HTL))

As a material which constitutes the positive hole transporting layer (HTL) of the present invention, an electron-donative material can be used preferably. In order to raise the mobility of a hole, the material which is treated various types of dopes can also be preferably used in the present invention.

Here, distinction of the material which can be preferably used for a positive hole transporting layer and the material which can be preferably used for an electron block layer is mainly judged from the magnitude of the thickness dependency to the series resistance of an element. Especially, it is preferable that the material preferably used for a positive hole transporting layer has a high positive hole transporting ability without largely changing a series resistance value depending on the thickness, even if the material does not have comparatively high electronic block ability.

Specific examples thereof are PEDOT-PSS (Baytron™ P, made by Starck-V Tech Co., Ltd.), polyaniline and their dope materials. Furthermore, the materials which can be used for a positive hole transporting layer are: a triarylamine disclosed in JP-A No. 5-271166, metal oxides such as molybdenum oxide, nickel oxide and tungsten oxide. Moreover, the layer which is made of a single p-type semiconductor material and used for a bulkhetero junction layer can also be used. As a method to form these layers, although it may be used a vacuum deposition method and a solution coating method, it is preferable to use a solution applying method. Before forming a bulk heterojunction layer, it is preferable to form a coated film as an underlaying layer in order to obtain the effect of leveling so that to decrease the leak.

The coating thickness range of an positive hole transporting layer is preferably 5 nm to 100 nm, it is more preferably from 10 nm to 70 nm, and it is still more preferably 15 nm to 50 nm, if it is 5 nm or more, the positive hole transporting layer can be obtained stably, and if it is less than 100 nm, since it can fully suppress the increase of the series resistance of an element, it is one of the preferred embodiments of the present invention.

Furthermore, it is still more preferable as one of the embodiments of the present invention that the following relationship is satisfied: $50>a>3\times b$, provided that "a" is the coating thickness of the above-mentioned positive hole transporting layer, "b" the coating thickness of the above-mentioned electron block layer.

(Positive Hole Block Layer (EBL))

As a material used for a positive hole block layer, an electron-receiving material can be used preferably. Even if it is not an electron-receiving compound, it is possible to use, if it is a compound which has a sufficient positive hole block property. Here, a positive hole block property is achieved by having a deeper HOMO level than the HOMO level of the p type semiconductor material used for a photoelectric conversion layer. For this reason, the positive hole generated in the photoelectric conversion layer is not conveyed to the second electrode side, as a result, it can achieve an element which shows an excellent rectifying characteristic. Such a rectifying characteristic is also called a positive hole block ability.

With respect to the energy difference between the HOMO level of the p type semiconductor material used in the aforesaid photoelectron conversion layer and the HOMO level of the material which forms the positive hole block layer, it is preferable for the embodiment of the present invention that the positive hole block layer has a deeper HOMO level than that of the p type semiconductor material by 0.5 eV or more. More preferably, it is deeper by 1.0 eV, and still more preferably, it is deeper by 1.5 eV.

Here, distinction of the material which can be preferably used for a positive hole block layer and the material which can be preferably used for an electron transporting layer is mainly judged from the magnitude of the thickness dependency to the series resistance of an element. Especially, although the material preferably used for a positive hole block layer excels in a positive hole block ability because there are few intermediate levels (an internal-defect level and an impurity level) between a HOMO level and a LUMO level, generally, the series resistance of an element will be extremely increased depending on the coating thickness when it becomes thick.

Examples of a material which can be used for a positive hole block layer of the present invention include: an oxadiazole derivative such as 1,3-bis(4-tert-butylphenyl-1,3,4-oxadiazolyl)phenylene (OXD-7), an anthraquinodimethane derivative, a diphenylquinone derivative, a phenanthrene compound such as a bathocuproine and a derivative thereof, a triazole compound, a tris(8-hydroxyquinolinate)alminium complex, a bis(4-methyl-8-quinolinate)alminium complex, a distyryl arylene derivative, a sylol derivative and alkali metal compounds such as lithium fluoride, sodium fluoride and cesium fluoride.

It is possible to use a compound If it has a sufficient positive hole transporting property, even if it is not an electron-receiving organic compound. It can be used the following compounds: a porphyrin compound, octaaza porphyrin, a perfluoro compound of a p-type semiconductor (perfluoro pentacene and perfluoro phthalocyanine), a styryl compound such as DCM (4-dicyanomethylene-2-methyl-6-(4-(dimethylamino styryl))-4H Piran) and a 4H pyran compound.

The coating thickness range of an positive hole block layer is preferably from 0.5 nm to 20 nm, it is more preferably from 1 nm to 10 nm, and it is still more preferably from 1.5 nm to 10 nm. If it is 0.5 nm or more, the coating thickness can be obtained stably, and if it is less than 20 nm, since it can fully suppress the increase of the series resistance of an element, it is one of the preferred embodiments of the present invention.

(Electron Transporting Layer (ETL))

As a material which constitutes the electron transporting layer (ETL) of the present invention, an electron-receiving material can be used preferably. Here, distinction of the material which can be preferably used for an electron transporting layer and the material which can be preferably used for a positive hole block layer is mainly judged from the magnitude of the thickness dependency to the series resistance of an element. Especially, it is preferable that the material preferably used for an electron transporting layer has a high electron transporting ability without largely changing a series resistance value depending on the thickness, even if the material does not have comparatively high positive hole block ability.

Examples of a material used for an electron transporting layer include: fullerene $C_{60}$, fullerene $C_{70}$, fullerene $C_{76}$, fullerene $C_{78}$, fullerene $C_{84}$, fullerene $C_{240}$, fullerene $C_{540}$, mixed fullerene, fullerene nano-tube, multi layer nano-tube, mono layer nano-tube, and nano-horn (cone type) and a fullerene derivative a part of which is substituted with a hydrogen atom, a halogen atom, a substituted or unsubstituted alkyl group, alkenyl group, alkynyl group, aryl group, heteroaryl group, cycloalkyl group, silyl group, ether group, thioether group, or amino group; an actaaza porphyrin group, a perfluoro compound of a p-type semiconductor (perfluoro pentacene and perfluoro phthalocyanine), naphthalene tetracarboxylic anhydride, diimide naphthalene tetracarboxylate, perylene tetracarboxylic anhydride, an n-type semiconductor material such as perylenediimide tetracarboxylate, a cyanide disclosed in WO 2006 019270 and WO 2007/146250, n-type inorganic oxide such as titanium oxide, zinc oxide and gallium oxide, n-type semiconductor single material used for a bulk heterojunction layer.

As a method to form these layers, although it may be used any one of a vacuum deposition method and a coating method, a coating method is preferably used. When a coating method is used, it is desirable in the present invention to choose suitably a solvent and a material which exhibit a high rinse-restive property and to use them so that an underlaying bulk heterojunction layer may not be dissolved by the application of an electron transportation layer.

The coating thickness range of an electron transporting layer is preferably from 5 nm to 100 nm, it is more preferably from 10 nm to 70 nm, and it is still more preferably from 15 nm to 50 nm. If it is 5 nm or more, the electron transporting layer can be obtained stably, and if it is less than 100 nm, since it can fully suppress the increase of the series resistance of an element, it is one of the preferred embodiments of the present invention.

Furthermore, it is still more preferable as one of the embodiments of the present invention that the following relationship is satisfied: $50>c>3\times d$, provided that "c" is the coating thickness of the above-mentioned electron transporting layer, "d" the coating thickness of the above-mentioned positive hole block layer.

(Photoelectric Conversion Layer: Bulk Heterojunction Layer)

A photoelectric conversion layer contains a p-type semiconductor material which transports a positive hole, and an n-type semiconductor material which transports an electron. In order to carry out efficiently charge separation of the exciton generated by light absorption, a basic structure is a 2 layer structure made of these p-type semiconductor material and n-type semiconductor material. Furthermore, in the present invention, it is preferable to form a bulk heterojunction structure in which the aforesaid p-type semiconductor material and n type semiconductor material were mixed as one of photoelectric conversion layers in respect of photoelectric conversion efficiency.

Furthermore, it may be the composition (it is also called p-i-n composition) which puts the photoelectric conversion layer of bulk heterojunction structure with the layers each composed of a simple p-type semiconductor material and a simple n type semiconductor material.

Although the usual bulk heterojunction layer is an i layer simple substance made of a mixture of a p-type semiconductor layer and a p-type semiconductor material, by putting the bulk heterojunction layer between the p layer which consists of a p-type semiconductor simple substance, and then layer which consists of an n type semiconductor simple substance, the rectifying effect of a positive hole and an electron becomes higher, the loss by the recombination of a positive hole and an electron which are in the state of charge separation will be reduced, and still higher photoelectric conversion efficiency can be acquired.

In the present invention, when the p-type semiconductor material or the n-type semiconductor material which can contribute to generation of electricity is used, the material which forms a p-i-n structure is used as a layer which clearly functions as a part of photoelectric conversion layer.

(P-Type Semiconductor Material)

As a p-type semiconductor material used for the photoelectron conversion layer (bulk heterojunction layer) of the present invention, various types of condensed polycyclic aromatic compounds and conjugated polymers and oligomers are cited.

Examples of a condensed polycyclic aromatic low molecular weight compound include: anthracene, tetracene, pentacene, hexacene, heptacene, chrysene, picene, fulminene, pyrene, peropyrene, perylene, terylene, quoterylene, coronene, ovalene, circumanthracene, bisanthene, zethrene, heptazethrene, pyanthrene, violanthene, isoviolanthene, circobiphenyl, anthradithiophene; porphyrin, copper phthalocyanine; tetrathiafulvalene (TTF)-tetracyanoquinodimethane (TCNQ) complex, bisethylenetetrathiafulvalene (BEDTTTF)-perchloric acid complex; and a derivative of a precursor thereof.

As examples of a derivative containing a condensed polycyclic compound include: pentacene compounds having a substituent disclosed in WO 03/16599, WO 03/28125, U.S. Pat. No. 6,690,029, and JP-A No. 2004-107216; pentacene precursors disclosed in US 2003/136964; substituted acenes and their derivatives disclosed in J. Amer. Chem. Soc., vol. 127, No. 14, p. 4986, J. Amer. Chem. Soc., vol. 123, p. 4982, and J. Amer. Chem. Soc., vol. 130, No. 9, p. 2706.

Examples of a conjugated polymer include: polythiophene such as 3-hexylthiohene (P3HT) and its oligomer, polythiophene having a polymerizable group disclosed in Technical Digest of the International PVSEC-17, Fukuoka, Japan, 2007, P. 1225, polythiophene-thienophene copolymer disclosed in Nature Material, Vol. 5, p. 328 (2006), polythiophene-diketopyrrolopyrrole copolymer disclosed in WO 2008/000664, polythiophene-thizolothiazole copolymer disclosed in Adv. Mat., p. 4160 (2007), polythiophene copolymer disclosed in Nature Material, Vol. 6, p. 497 (2007), polypyrrole and its oligomer, poly aniline, polyphenylene and its oligomer, polyphenylene vinylene and its oligomer, poly thienylene vinylene and its oligomer, polyacetylene, polydiacetylene, σ conjugated polymers such as polysilane and polygerman.

Suitably usable oligomers rather than polymers are: thiophene hexamers such as: α-sexithionene, α,ω-dihexyl-α-sexithionene, α, ω-dihexyl-α-quinquethionene, and α,ω-bis (3-butoxypropyl)-α-sexithionene.

Among these, preferred are compounds which has a sufficient high solubility to an organic solvent to be able to carry out a solution process, and which forms a crystalline thin film and can realize a high mobility after drying.

When an electron transporting layer is formed on an photoelectric conversion layer with a coating method, since there may occur the problem that the solution for the electron transporting layer may dissolve the photoelectric conversion layer, it can be used a material which will become insoluble after forming a layer with a solution process.

Examples of such materials include: a polythiophene compound having a polymerizable group which becomes insoluble through cross-linked polymerization after being coated as described in Technical Digest of the International PVSEC-17, Fukuoka, Japan, 2007, p. 1225; a compound having a solubilizing group which becomes insoluble (becomes to a pigment) by addition of thermal energy as described in US 2003/136964 and JP-A No. 2008-16834.

There is no limitation in particular to an n-type semiconductor material used in the bulk heterojunction layer. Examples of such n-type semiconductor material include: fullerene, octaazaporphyrin, a perfluoro compound of a p-type semiconductor (perfluoropentacene and perfluorophthalocyanine), a polymer compound which contains an aromatic carboxylic acid anhydride and its imide in the structure, such as naphthalenetetracarboxylic anhydride, naphthalenetetracarboxylic diimide, perylenetetracarboxylic anhydride, and perylenetetracarboxylic diimide.

Among the above-described n-type semiconductor materials, a fullerene derivative is most preferably used since it ca be expected high charge separation ability (high-speed electron injection at a speed of 50 fs) with an interaction with a p-type semiconductor material.

Examples of a fullerene derivative include: fullerene $C_{60}$, fullerene $C_{70}$, fullerene $C_{76}$, fullerene $C_{78}$, fullerene $C_{84}$, fullerene $C_{240}$, fullerene $C_{540}$, mixed fullerene, fullerene nano-tube, multi layer nano-tube, mono layer nano-tube, and nano-hom (cone type) and a fullerene derivative a part of which is substituted with a hydrogen atom, a halogen atom, a substituted or unsubstituted alkyl group, alkenyl group, alkynyl group, aryl group, heteroaryl group, cycloalkyl group, silyl group, ether group, thioether group, or amino group.

Among these, it is preferable to use a fullerene derivative which has an improved solubility by an introduction of a substituent. Examples thereof are: [6,6]-phenyl C61-butyric acid methyl ester (abbreviated name PCBM), [6,6]-phenyl C61-butyric acid n-butyl ester (PCBnB), [6,6]-phenyl C61-butyric acid isobutyl ester (PCBiB), [6,6]-phenyl C61-butyric acid n-hexyl ester (PCBH), bis-PCBM described in Adv. Mater., Vol. 20 (2008), p. 2116, metallocene fullerene described in JP-A No. 2008-130889, and fullerene containing a cyclic ether group described in U.S. Pat. No. 7,329,709.

(Other Functional Layer)

In order to enter an external light in the photoelectric conversion layer 14, it is preferable that the above-mentioned substrate 11 and the first electrode (anode 12), or the second electrode (cathode 13) is substantially transparent to the light having a wavelength band which contributes to generation of electricity. It is more preferable that the substrate 11 and the first electrode (anode 12) are transparent, and there is made a composition in which the second electrode (cathode 13) will reflect the light which has entered into the first electrode side, and has passed through the photoelectric conversion layer 14. Moreover, in the present invention, it can be preferably used a composition in which the substrate and the first electrode (anode 12), and the second electrode (cathode 13) are all transparent.

When the first electrode is an anode, as mentioned above, it is preferable to have a positive hole transporting layer between the first electrode and a photoelectric conversion layer because of the composition which mainly takes out a positive hole among the carriers which consist of a positive hole and an electron. Similarly, when the second electrode is a cathode, it is preferable to have an electron transportation layer between the second electrode and a photoelectric conversion layer because of the composition which mainly takes out an electron.

Furthermore, it is also good to make a composition of a tandem type by laminating such photoelectric conversion layers for the purpose of improvement in a natural sunlight utilization factor (photoelectric conversion efficiency). Although the laminated photoelectric conversion layers each may absorb the same spectrum light, it is preferable that the laminated photoelectric conversion layers each absorb a different spectrum light.

For the purpose of improvement in a natural sunlight utilization factor (photoelectric conversion efficiency), it is possible to make a photoelectric conversion element having a composition of a back contact type in which the photoelectric conversion element is formed on a pair of comb dentate electrodes in place of the sandwich structure in the photoelectric conversion element 10 shown in FIG. 2.

Furthermore, although not listed in FIG. 2, it is good also good as a composition which has a various types of intermediate layers in the element for the purpose of improvement in energy conversion efficiency, and improvement in the lifetime of the element. Examples of an intermediate layer include: a positive hole injection layer, an electron injection layer, an exciton block layer, UV absorption layer, a light reflection layer, a wavelength conversion layer and a smoothing layer.

(Second Electrode: Counter Electrode)

The second electrode (counter electrode) of the present invention may be a conducting material independent layer. In addition to the material which has conductivity, it may be uses a resin which holds such material together. As a conducting material used for a counter electrode, it can be used: a metal, an alloy, an electric conductive compound, and a mixture thereof, which has a small work function (less than 4 eV). Specific examples of such electrode material include: sodium, a sodium potassium alloy, magnesium, lithium, a magnesium/copper mixture, a magnesium/silver mixture, a magnesium/aluminum mixture, a magnesium/indium mixture, an aluminum/aluminium oxide ($Al_2O_3$) mixture, indium, a lithium/aluminium mixture and a rare earth metal. Among these, from the viewpoint of an electron taking out property and resistivity to oxidation, a mixture of these metals and the second metal having a larger work function than these metals is suitable. Examples of these are: a magnesium/silver mixture, a magnesium/aluminum mixture, a magnesium/indium mixture, an aluminum/aluminium oxide ($Al_2O_3$) mixture, a lithium/aluminum mixture and aluminium. A counter electrode can be produced by using these electrode materials with a method such as a vacuum evaporation method or a sputtering method. Moreover, the coating thickness is usually chosen from the range of 10 nm to 5 μm, and preferably it is chosen from the range of 50 to 200 nm.

When a metallic material is used as a conducting material of a counter electrode, the light arriving at the counter electrode will be reflected and will be also reflected by the first electrode side, and this light can be reused. As a result, the light is again absorbed by the photoelectric conversion layer to result in improvement of photoelectric conversion efficiency. This is desirable.

Moreover, a counter electrode may be nano particles, nanowires, or a nano structure material which is made of a metal (for example, gold, silver, copper, platinum, rhodium, ruthenium, aluminium, magnesium and indium) and carbon. When it is a dispersion of nanowires, a transparent and high conductive counter electrode can be formed by a coating method, and it is desirable.

When the counter electrode side is made to be light transparent, it can be achieved as follows. After producing thin film of a conductive material suitable for counter electrodes, such as an aluminium, an aluminum alloy, silver or a silver compound to have a coating thickness of about 1 to 20 nm, a light transmissive counter electrode can be prepared by providing on the thin film with the membrane of a conductive light transparent material cited in the description of the above-mentioned transparent electrode.

[Substrate]

When the light by which photoelectric conversion is carried out enters from the substrate side, it is preferable that the substrate is made of a member enabling to transmit the light by which photoelectric conversion is carried out. That is, it is preferable that the substrate is made of a transparent member to the wave length of this light that should be carried out photoelectric conversion. As for a substrate, although a glass substrate and a resin substrate are cited suitably, it is preferable to use a transparent resin film from the viewpoints of lightness and flexibility. In the present invention, there is no restriction in particular to the transparent resin film which can be preferably used as a transparent substrate, and it can be suitably chosen from the known materials with respect to form, structure and thickness. Specific examples of a resin film include: a polyester resin film such as polyethylene terephthalate (PET) and polyethylene naphthalate (PEN) and modified polyester; a polyolefin resin film such as a polyethylene (PE) resin film, a polypropylene (PP) resin film, a polystyrene resin film and a cyclic olefin resin; a vinyl resin film such as polyvinylchloride and polyvinylidene chloride; a polyether ether ketone (PEEK) resin film, a polysulfone (PSF) resin film, a polyethersulfone (PES) resin film, a polycarbonate (PC) resin film, a polyamide resin film, a polyimide resin film, an acrylic resin film and a triacetyl cellulose (TAC) resin film. If the resin film exhibits transmittance for the light of a visible range (380 to 800 nm) is 80% or more, it is preferably applicable to the transparent resin film concerning the present invention. Especially, from the viewpoints of transparency, heat resistivity, ease of handling, strength and cost, the following resins are preferable: a biaxial stretching polyethylene terephthalate film, a biaxial stretching polyethylenenaphthalate film, a polyethersulfone film and a polycarbonate film. Among them, a biaxial stretching polyethylene terephthalate film and a biaxial stretching polyethylenenaphthalate film are more preferable.

In order to secure the wettability and the adhesion property of a coating solution, surface treatment can be performed and an adhesion assisting layer can be prepared to the transparent substrate used for the present invention. About surface treatment or an adhesion assisting layer, a well-known technique can be used conventionally. For example, as surface treatment, there can be cites a surface activation process such as: corona discharge treatment, flame treatment, ultraviolet treatment, high-frequency treatment, glow discharge process, activity plasma treatment and laser process. Moreover, as an adhesion assisting layer, there can be cites: polyester, polyamide, polyurethane, vinyl system copolymer, butadiene system copolymer, acrylic system copolymer, vinylidene system copolymer and epoxy system copolymer.

In order to control transmission of oxygen and water vapor, a barrier coat layer may be formed beforehand to the transparent substrate, and a hard court layer may be formed beforehand on the opposite side which is transferred a transparent conductive layer.

[Optical Function Layer]

The organic photoelectric conversion element of the present invention may be provided with a various types of optical function layers for the purpose of efficient light receiving of sunlight. As an optical function layer, there may be provided with an anti-reflection layer, a light condensing layer such as a microlens array, a light diffusion layer which can scatter the light reflected by the cathode and can make the light enter again in a photoelectric conversion layer.

As an anti-reflection layer, well-known anti-reflection layer can be prepared. For example, when a transparent resin film is a biaxial stretching polyethylene terephthalate film, it is preferable to set the refractive index of the adhesion assisting layer, which is adjacent to the film, to be 1.57 to 1.63. This will improve transmittance with decreasing the interface reflection between the film substrate and the adhesion assisting layer. As a way of adjusting a refractive index, it can be carried out by adjusting suitably the ratio of a binder resin to oxide sal having a comparatively high refractive index such as a tin oxide sol and a cerium oxide sol and by coating it. Although a single layer of adhesion assisting layer may be sufficient, in order to raise adhesion property, a composition of two or more adhesion assisting layers may be used.

Examples of a light condensing layer are as follows: to set a structure of a micro lens array on the sunlight receiving side of the substrate; and to combine a so-called light condensing sheet to increase an amount of the receiving light from a specific direction, or conversely, to decrease incident angle dependability of sunlight.

As an example of a microlens array, it can be cited an arrangement in which the quadrangular pyramidal forms having a base of 30 μm and a vertex angle of 90 degrees are arranged in two dimensions on the light taking out side of a substrate. As for a base, the range of 10 to 100 μm is desirable. When it is smaller than this range, the effect of diffraction will occur to result in coloring, while when it is larger than this range, the thickness becomes large. They are not desirable.

Moreover, as a light scattering layer, a various types of anti-glare layers and a layer in which are distributed nanoparticles or nanowire made of metal or various inorganic oxides in a colorless transparent polymer can be cited.

(Film Production Method and Surface Treatment Method)

As a formation method of a photoelectric conversion layer mixed with an electron acceptor and an electron donor, a transporting layer and an electrode, a vacuum deposition method and a coating method (including a cast method and a spin coat method) can be cited. Among these, as a formation method of a photoelectric conversion layer, a vacuum deposition method and a coating method (including a cast method and a spin coat method) can be cited. Among these, a coating method is preferable in order to increase the area of the interface which carries out charge separation of the above-mentioned positive hole and electron and to produce an element having high photoelectric conversion efficiency. Moreover, the coating method is excellent also in production velocity.

Although there is no restriction in the coating method to be used, examples of the methods are cited as: a spin coat method, a cast method from a solution, a dip coat method, a blade coat method, a wire bar coat method, a gravure coat method and a spray coat method. In addition, it can be used the pattering method using printing methods such as: an ink-jet method, a screen printing method, a typographic printing method, an intaglio printing method, an offset printing method and a flexography method.

After coating, it is preferable to heat the film in order to remove the residual solvent, water and a gas, as well as to improve the mobility and to make the absorption in the longer wavelength by crystallization of a semiconductor material. When an annealing treatment is carried out at a prescribed temperature during a manufacturing process, aggregation or crystallization is microscopically promoted and a suitable phase separation structure can be made in a photoelectric conversion layer. As a result, the carrier mobility of a photoelectric conversion layer can be improved and high efficiency can be obtained.

The photoelectron conversion layer (bulk heterojunction layer) 14 may be a single layer containing a uniform mixture of an electron acceptor and an electron donor. It may be a multiplicity of layers each changing the mixing ratio of an electron acceptor and an electron donor.

[Sealing]

In order to prevent deterioration of the produced organic photoelectric conversion element by oxygen or water existing in an ambient, it is preferable to carry out sealing with a well-known approach not only in the filed of an organic photoelectric conversion element but also in the field of an organic electroluminescence element. For example, the following methods can be cited: method of carrying out sealing by pasting up the cap made of aluminium or glass with an adhesive agent; a method of adhering a plastic film in which a gas barrier layer made of aluminium, silicon oxide, or aluminium oxide has been formed, with an organic photoelectric conversion element with an adhesive agent; a method of spin coating a polymer material having a high gas barrier property (for example, polyvinyl alcohol); a method of depositing under a vacuum condition an inorganic thin film (for example, silicon oxide and aluminium oxide), or an organic layer (foe example, parylene) which has a high barrier property; and a method of laminating these layers by combining these methods.

Further, in the present invention, a composition which carried out sealing of the whole element with two substrates provided with a barrier can be used from the viewpoint of improving the energy conversion efficiency and the lifetime of an element. It is more preferable in the present invention to take a composition of having enclosed the water content getter in the element.

EXAMPLES

The present invention is described below with reference to examples, but the present invention is not limited to these. In examples, "%" will be used. Unless particularly mentioned, this represents "weight %".

Synthesis of Polymer A

Living Radical Polymerization Method Using ATRP (Atom Transfer Radical Polymerization) Method

Synthesis of Initiator 1

Synthetic Example 1

Synthesis of Methoxy Capped Oligo(Ethylene Glycol) Methacrylate

In a 50 ml three necked flask were placed 7.3 g (35 mmol) of 2-bromoisobutyryl bromide, 2.48 g (35 mmol) of triethylamine and 20 ml of THF. The inner temperature of the solution was kept to be 0° C. with an ice bath. Into the solution was dropwise added 10 g (23 mmol) of oligo(ethylene glycol) (the number of ethylene glycol being 7 to 8, made by Laporte Specialties Co., Ltd.) as 33% of THF solution in an amount of 30 ml. After stirring the solution for 30 minutes, the temperature of the solution was raised to room temperature, and further the solution was stirred for 4 hours. THF was removed under reduced pressure with a rotary evaporator. The residue was dissolved in ethyl ether and transferred into a separation funnel. Water was added in the separation funnel to wash the ether layer. After repeating this process 3 times, the ether layer was dried with $MgSO_4$. Ether was removed under reduced pressure with a rotary evaporator to obtain 8.2 g (yield: 73%) of Initiator 1.

Synthesis of Water Soluble Binder Resin Via Living Polymerization Method (ATRP)

Synthetic Example 2

Synthesis of poly(2-hydroxyethyl methacrylate)

Into a Schlenk flask were placed 500 mg (1.02 mmol) of Initiator 1, 4.64 g (40 mmol) of 2-hydroxyethyl methacrylate (made by Tokyo Kasei Co., Ltd.) and 5 ml of a water-methanol mixed solvent (50:50 (v/v %)). The Schlenk flask was immersed in liquid nitrogen under a reduced pressure for 10 minutes. The Schlenk flask was taken out from liquid nitrogen. After 5 minutes, nitrogen gas substitution was carried out. This operation was repeated three times. Then, 400 mg (2.56 mmol) of bipyridine and 147 mg (1.02 mmol) of CuBr were added into the Schlenk flask under nitrogen and stirred at 20° C. After 30 minutes, the reaction solution was dropped on a Kiriyama Rohto (diameter of 4 cm) provided with a filter paper and silica and the reaction solution was recovered. The solvent was removed under a reduced pressure with a rotary evaporator. The residue was dried under a reduced pressure at 50° C. for 3 hours to yield 2.60 g (yield: 84%) of Water soluble binder resin 1. The produced Water soluble binder resin 1 exhibited the number average molecular weight of 13,100, molecular weight distribution of 1.17, and the content of the components of a molecular weight of less than 1,000 was 0 weight %.

The structure and molecular weight of PHEA-1 were respectively measured with $^1$H-NMR. (400 MHz, made by JEOL Ltd.) and GPC (Waters 2695, made by Waters Co., Ltd.).
<GPC Measurement Conditions>
Apparatus: Wagers 2695 (Separations Module)
Detector: Waters 2414 (Refractive Index Detector)
Column: Shodex Asahipak GF-7M HQ
Eluant: Dimethylformamide (20 mM LiBr)
Flow rate: 1.0 ml/min
Temperature: 40 degrees C.

The produced Water soluble binder resin 1 was dissolved in pure water to prepare an aqueous solution of Water soluble binder resin 1 having a solid content of 20%.

Subsequently, a binder liquid containing a conductive polymer was prepared as described below.

| (Conductive polymer containing binder liquid (b-1)) | |
|---|---|
| Aqueous solution of Water soluble binder resin 1 (solid content of 20%) | 0.35 g |
| PEDOT-PSS CLEVIOS PH510 (solid content of 1.89%, made by H. C. Starck Co., Ltd.) | 1.59 g |

Preparation of First Electrode

Preparation of TC-11: Present Invention

A transparent electrode TC-11 was prepared according to the method described below.

As metal wires, there were prepared silver nanowires having an average minor axis of 75 nm and an average length of 35 μm using poly(vinyl pyrrolidone) K30 (molecular weight of 50,000, made by ISP Co., Ltd.) with reference to the method described in Adv. Mater., 2002, 14, 833-837. The prepared silver nanowires were filtered using a ultrafiltration membrane followed by washing with water. Then, the silver nanowires were re-dispersed in an aqueous solution of hydroxypropyl methyl cellulose (HPMC) 60SH (made by Shin-Etsu Chemical Co., Ltd), wherein hydroxypropyl methyl cellulose (HPMC) 60SH was added in an amount of 25 weight % with respect to silver. Thus a silver nanowire dispersion NW-1 was prepared.

The silver nanowire dispersion NW-1 produced by the above-described method was coated on a PEN substrate using a spin coater so that the coated amount of the silver nanowires became 70 mg/m$^2$. Then the coated layer was subjected to a heat treatment at 120° C. for 20 minutes and patterning of 1 cm width followed by calender treatment. On the prepared silver wire electrode was coated the conductive polymer containing binder liquid (b-1) prepared beforehand using a spin coater so that the dried thickness became 300 nm, and then it was subjected to a heat treatment at 120° C. for 20 minutes. Subsequently, the coated film was cut in a size of 50 mm×50 mm to obtain a transparent electrode TC-11.

After thermal treatment FT-IR measurement was carried out with the transparent electrode TC-11. Formation of a cross-linkage was confirmed by the presence of an absorption peak at 1140 cm$^{-1}$ originated from an ether bond and an absorption peak at 1180 cm$^{-1}$ originated from sulfonic acid ester. In addition, the formation of a cross-linkage was confirmed by confirmed by the improvement of nanoindentation elasticity (elasticity measurement with AFM).

In order to evaluate the smoothness, the surface smoothness Ra of the sample TC-11 was measured using an atomic force microscope (AFM) (SPI3800N probe station and SPA400 multifunctional-capability type module made by Seiko Instruments Co., Ltd.). The employed cantilever was a silicon cantilever SI-DF20 (made by Seiko Instruments Co., Ltd.), and measurement was done in a DFM mode (Dynamic Force Mode) using the resonant frequency of 120-150 kHz, the spring constant of 12-20 N/m. The portion of 10×10 μm was measured with the scanning frequency of 1 Hz. The smoothness was evaluated by an arithmetic average smoothness Ra obtained with the method based on the surface smoothness measurement specified by JIS B601 (1994). As a transparent electrode, it is preferable that Ra is 50 nm or less. After measurement, it was found that Ra of TC-11 was 46 nm.

Preparation of TC-12: Comparative Example

A transparent electrode TC-12 was prepared in the same manner as preparation of TC-11 except that the conductive polymer containing binder liquid (b-1) was replaced with PEDOT-PSS CLEVIOS PH510 (solid content of 1.89%, made by H. C. Starck Co., Ltd.) and the coating was done so that the dried thickness became 100 nm.

After smoothness measurement using an atomic force microscope, it was found that Ra of TC-12 was 89 nm.

Preparation of TC-13: Comparative Example (Preparation of Solution 1)

To 100% of cyclohexanone as a solvent were added 7 weight parts of vinyl chloride powder as a thermoplastic resin, 0.5% of multi-layer carbon nanotube (an average outer diameter of 10 nm, a product made by Tsinghua-Nafine Nano-Powder Commercialization Engineering Center, the coated amount of 14 mg/m$^2$), and 0.2% of an alkyl ammonium solution of an acidic polymer as a dispersing agent. The obtained solution was named as Solution 1.

(Preparation of TC-13)

The obtained Solution 1 was coated on a surface of a PEN substrate and the coated solution was heated at 120° C. for 20 minutes to dry and harden. Then it was pressed at 120° C. with a pressure of 2.942 MPa to obtain a transparent electrode TC-13 having a conductive layer having a thickness of 190 nm.

After smoothness measurement using an atomic force microscope, it was found that Ra of TC-13 was 81 nm.

Preparation of TC-14: Present Invention, Particles Incorporated (Preparation of Solution 2)
<Preparation of Modified Aqueous Polyester A>

To a reaction vessel for polycondensation, there were put 35.4 weight parts of dimethyl terephthalate, 33.63 weight parts of dimethyl isophthalate, 17.92 weight parts of 5-sulfo-dimethyl isophthalate sodium salt, 62 weight parts of ethylene glycol, 0.065 weight part of calcium acetate monohydrate and 0.022 weight part of manganese acetate 4 water salts. After performing trans-esterification with removing methanol at 170 to 220° C. under a nitrogen gas flow, there were added 0.04 weight parts of trimethyl phosphate, 0.04 weight parts of antimony trioxide as a polycondensation catalyst and 6.8 weight parts of 1,4-cyclohexane dicarboxylic acid. At a reaction temperature of 220 to 235° C., almost all of the theoretical amount of water was removed to complete an esterification. Then, further, for about 1 hour, the inside of the reaction system was decompressed ant the temperature was increased. At a final stage, polycondensation was performed at 280° C. at 133 Pa or less for about 1 hour, and the precursor of modified aqueous polyester A was obtained. The intrinsic viscosity of the precursor was 0.33.

In a 2 L three necked flask equipped a stirrer, a condenser and a thermometer were charged with 850 ml of pure water. While rotating the stirrer, 150 g of the above-mentioned precursor was added gradually. After stirring for 30 minutes at room temperature, the mixture was heated so that the inner temperature became 98° C. over 1.5 hours, and heat melting was carried out at this temperature for 3 hours. After termination of the heating, the reaction mixture was cooled to room temperature over 1 hour, and it was left one night to prepare a solution whose solids concentration was 15 weight %.

In a 3 L four necked flask equipped a stirrer, a condenser, a thermometer and a dropping funnel were charged with 1,900 ml of the above-described precursor solution. While rotating the stirrer, the precursor solution was heated so that the inner temperature became 80° C. Into this was added 6.52 ml of a 24% aqueous ammonium persulfate solution. To this solution was dropped a monomer mixture (28.5 g of glycidyl methacrylates, 21.4 g of ethyl acrylate and 21.4 g of methyl methacrylates) for 30 minutes, and the reaction was continued for further 3 hours. Then, the reaction mixture was cooled to 30° C. or less and filtered to obtain a solution of modified aqueous polyester A whose solids concentration is 18 weight % (polyester component/acrylic component=80/20).

| (Preparation of Solution 2) | |
|---|---|
| TiO$_2$ particles (TTO-55, solid content of 98%, made by Ishihara Sangyo Kaisya, Ltd.) | 30 g |
| Compound (UL-1) | 0.2 g |
| Modified aqueous polyester A solution (solid content of 18%) | 30 g |
| Water | to make 1,000 ml |

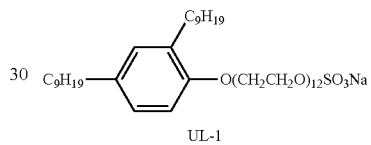

UL-1

| (Conductive polymer containing binder liquid (b-2)) | |
|---|---|
| Aqueous solution of Water soluble binder resin 1 (solid content of 20%) | 0.35 g |
| PEDOT-PSS CLEVIOS PH510 (solid content of 1.89%, made by H. C. Starck Co., Ltd.) | 1.59 g |
| Solution 2 | 0.60 g |

A transparent electrode TC-14 was prepared in the same manner as preparation of TC-11 except that the conductive polymer containing binder liquid (b-2) was used instead of PEDOT-PSS and the coating was done so that the dried thickness became 300 nm.

After measurement, it was found that Ra of TC-14 was 72 nm.

Preparation of TC-15: Present Invention, Particles Incorporated in TC-14 was Replaced with SnO$_2$

| (Preparation of Solution 2) | |
|---|---|
| SnO$_2$ sol (Ceramase S-8, solid content of 8%, made by Taki Chemical, Co., Ltd.) | 160 g |
| Compound (UL-1) | 0.2 g |
| Modified aqueous polyester A solution (solid content of 18%) | 30 g |
| Water | to make 1,000 ml |

| (Conductive polymer containing binder liquid (b-3)) | |
| --- | --- |
| Aqueous solution of Water soluble binder resin 1 (solid content of 20%) | 0.35 g |
| PEDOT-PSS CLEVIOS PH510 (solid content of 1.89%, made by H. C. Starck Co., Ltd.) | 1.59 g |
| Solution 3 | 0.60 g |

A transparent electrode TC-15 was prepared in the same manner as preparation of TC-11 except that the conductive polymer containing binder liquid (b-3) was used instead of the conductive polymer containing binder liquid (b-1) and the coating was done so that the dried thickness became 300 nm.

After measurement, it was found that Ra of TC-15 was 64 nm.

<<Refractive Index>>

The independent film of the transparent conductive layer of each ingredient was formed on a PET film, and by using Spectroscopic ellipsometer VASE (made by J. A. Woollam, Co., Ltd.), ellipsometry parameters $\phi$ (psi) and $\Delta$ (delta) were measured in the range of an incidence angle of 45 to 75° at an inerval of 5°, and for the wavelength of 245 to 1,000 nm at an interval of 1.6 nm. The obtained data were analyzed using the analyzing software made by J. A. Woollam Co., Ltd. to obtain the refractive index. In addition, the refractive index obtained at 550 nm was used.

Preparation of Organic Photoelectric Conversion Element SC-11

On the first electrode TC-11 was spin coated a conductive polymer PEDOT/PSS (Baytron P4083, made by H. C. Starck, Co., Ltd.) which is a conducting polymer as a positive hole transporting layer (HTL) so that to form a thickness of 30 nm. Then it was heated to dry at 140° C. for 10 minutes in the air.

After this, TC-11 which was provided with the above-mentioned conductive polymer layer was carried in into a glove box, and operation was made under the nitrogen atmosphere.

First, the above-mentioned TC-11 was heat-treated for 3 minutes at 120° C. under the nitrogen atmosphere. Next, there was prepared a chlorobenzene solution by dissolving 1.0 weight % of P3HT (poly-3-hexylthiophene, Mn=45,000, regioregular type, polymer p-type semiconductor material, made by Rike Metal, Co., Ltd) and 1.0 weight % of PCBM (frontier carbon: 6,6-phenyl-C61-butyric acid methyl ester, Mw=911, low molecular n type semiconductor material). Subsequently, the chlorobenzene solution was the spin coated for 60 seconds at 500 rpm, then for 1 second at 2,200 rpm, while filtering with a 0.45 µm filter. After leaving the coating was left at room temperature for 30 minutes, it was heated at 140° C. for 30 minutes.

Next, the substrate on which were formed a series of the above-mentioned organic photoelectric conversion layers was installed in a vacuum vapor-deposition apparatus. After having set the element so that a transparent electrode and the shadow mask of 1 cm width might cross at right angles, the inner portion of the vacuum vapor-deposition apparatus was decompressed to be below to $10^{-3}$ Pa. Then, there were vapor-deposited lithium fluoride with a thickness of 5 mm and aluminium with a thickness of 80 nm with a vapor-deposition rate of 2 nm/second. Thus, organic photoelectric conversion element SC-11 having a size of 1 cm square was obtained. On the surrounding of the cathode of the obtained organic photoelectric conversion element SC-11 was applied an adhesive agent except the edge portion so that the external taking out terminals of the anode (the first electrode) and the cathode (the second electrode) can be formed. After adhering a flexible sealing member which is mainly made of polyethylene terephthalate as a substrate to it, it was subjected to a heat treatment to harden the adhesive agent.

Preparation of Organic Photoelectric Conversion Element SC-12

SC-12 was prepared in the same manner as preparation of organic photoelectric conversion element SC-11, except that TC-12 was used instead of using TC-11 as a first electrode. On the surrounding of the cathode of the obtained organic photoelectric conversion element SC-12 was applied an adhesive agent except the edge portion so that the external taking out terminals of the anode and the cathode can be formed. After adhering a flexible sealing member which is mainly made of polyethylene terephthalate as a substrate to it, it was subjected to a heat treatment to harden the adhesive agent.

Preparation of Organic Photoelectric Conversion Element SC-13

SC-13 was prepared in the same manner as preparation of organic photoelectric conversion element SC-11, except that TC-13 was used instead of using TC-11 as a first electrode. On the surrounding of the cathode of the obtained organic photoelectric conversion element SC-13 was applied an adhesive agent except the edge portion so that the external taking out terminals of the anode and the cathode can be formed. After adhering a flexible sealing member which is mainly made of polyethylene terephthalate as a substrate to it, it was subjected to a heat treatment to harden the adhesive agent.

Preparation of Organic Photoelectric Conversion Element SC-14

SC-14 was prepared in the same manner as preparation of organic photoelectric conversion element SC-11, except that TC-14 was used instead of using TC-11 as a first electrode. On the surrounding of the cathode of the obtained organic photoelectric conversion element SC-14 was applied an adhesive agent except the edge portion so that the external taking out terminals of the anode and the cathode can be formed. After adhering a flexible sealing member which is mainly made of polyethylene terephthalate as a substrate to it, it was subjected to a heat treatment to harden the adhesive agent Preparation of Organic Photoelectric Conversion Element SC-15

SC-15 was prepared in the same manner as preparation of organic photoelectric conversion element SC-11, except that TC-15 was used instead of using TC-11 as a first electrode. On the surrounding of the cathode of the obtained organic photoelectric conversion element SC-15 was applied an adhesive agent except the edge portion so that the external taking out terminals of the anode and the cathode can be formed. After adhering a flexible sealing member which is mainly made of polyethylene terephthalate as a substrate to it, it was subjected to a heat treatment to harden the adhesive agent.

<<Evaluation of Energy Conversion Property>>

The organic photoelectric conversion elements prepared in the above-described methods were with a light of Solar Simulator (AM1.5G) with a power of 100 mW/cm². With laminating a mask on a light receiving portion of each of the elements, the voltage-electric current characteristics (I-V characteristics were measured.

Energy conversion efficiency η (%) (photoelectric conversion efficiency) was obtained from the Scheme 1, using a short circuit current density Jsc (mA/cm²), an open circuit voltage Voc (V) and a file factor ff as characteristic values.

$$Jsc(mA/cm^2) \times Voc(V) \times ff = \eta(\%) \qquad \text{Scheme 1:}$$

<<Evaluation of Light Resistivity>>

From each sample, a stripe was cut. A solar battery panel was irradiated with a light of metal halogen lamp (false natural sunlight) of 100 mW/cm$^2$ for 1,000 hours. The energy conversion efficiency after irradiation of the light was measured at four light receiving portions formed on the element. An average value was calculated from the measured values for each element.

TABLE 1

| Photoelectric conversion element | First electrode | Refractive index of photoelectric conversion layer | Refractive index of transparent conductive layer | Light resistance (%) | Photoelectric conversion efficiency (%) | Remarks |
|---|---|---|---|---|---|---|
| SC-11 | TC-11 | 1.72 | 1.51 | 2.10 | 2.15 | Present invention |
| SC-12 | TC-12 | 1.72 | 1.44 | 0.12 | 0.81 | Comparative example |
| SC-13 | TC-13 | 1.72 | 1.54 | 0.20 | 0.97 | Comparative example |
| SC-14 | TC-14 | 1.72 | 1.79 | 2.70 | 2.94 | Present invention |
| SC-15 | TC-15 | 1.72 | 2.01 | 2.83 | 3.01 | Present invention |

As is shown from the results in Table 1, the organic photoelectric conversion element of the present invention which has the composition of the first electrode embedded metal nanowires electrode in the transparent conductive layer, and was made to smooth the surface thereof was found that there was little decrease in the photoelectric conversion efficiency after a temperature and humidity cycle, because the electrode itself forms a flat electrode and no mechanical resistance is loaded to a portion of electrode. Furthermore, by mixing the particles which raise the refractive index into the transparent conductive layer of the first electrode, there was produced an optical confining effect and the photoelectric conversion efficiency was improved.

What is claimed is:

1. An organic photoelectric conversion element comprising:
   a first electrode;
   a second electrode; and
   an organic photoelectric conversion layer sandwiched between the first electrode and the second electrode,
   wherein the first electrode comprises:
   a conductive fiber layer; and
   a transparent conductive layer containing a conductive polymer comprising a π conjugated conductive polymer and a polyanion, and an aqueous binder, and
   at least a part of the transparent conductive layer containing the conductive polymer and the aqueous binder is cross-linked therein, wherein the aqueous binder comprises Polymer (A) containing the following recurring units:

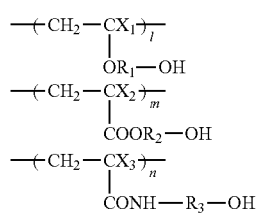

Polymer (A)

wherein $X_1$ to $X_3$ each respectively represent a hydrogen atom or a methyl group; $R_1$ to $R_3$ each respectively represent an alkylene group having a carbon number of 5 or less; l, m and n each respectively represent a ratio of each recurring unit when the total molar number of monomers composing Polymer (A) is set to be 100, provided that l, m and n satisfy the relationship of: $50 \leq l+m+n \leq 100$.

2. The organic photoelectric conversion element of claim 1, wherein the polyanion contains a sulfo group as an anionic group.

3. The organic photoelectric conversion element of claim 1, wherein the conductive fiber layer is a metal nanowire.

4. The organic photoelectric conversion element of claim 1, wherein the first electrode comprises:
   the conductive fiber layer containing a metal nanowire; and
   the transparent conductive layer containing (i) the conductive polymer comprising the π conjugated conductive polymer and the polyanion; and (ii) the aqueous binder comprising Polymer (A) containing the foregoing recurring units.

5. The organic photoelectric conversion element of claim 1, wherein the transparent conductive layer which composes the first electrode contains conductive particles.

6. A method for forming an organic photoelectric conversion element comprising the steps of:
   coating a conductive fiber containing liquid on a substrate;
   drying the coated conductive fiber containing liquid;
   coating a liquid containing a conductive polymer comprising a π conjugated conductive polymer and a polyanion, and an aqueous binder comprising Polymer (A) having the following recurring units to form a first electrode;
   forming an organic photoelectric conversion layer; and
   forming a second electrode:

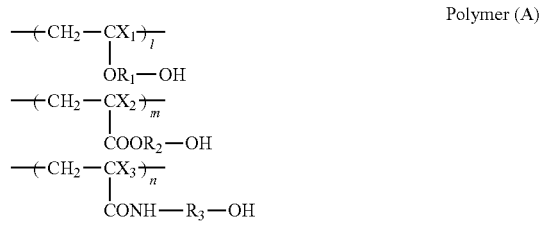

Polymer (A)

wherein, $X_1$ to $X_3$ each respectively represent a hydrogen atom or a methyl group; $R_1$ to $R_3$ each respectively represent an alkylene group having a carbon number of 5 or less; l, m and n each respectively represent a ratio of each recurring unit when the total molar number of monomers composing Polymer (A) is set to be 100, provided that l, m and n satisfy the relationship of: 50≤l+m+n≤100.

* * * * *